United States Patent
Ishino et al.

(10) Patent No.: US 12,213,376 B2
(45) Date of Patent: Jan. 28, 2025

(54) ORGANIC PHOTOELECTRIC CONVERSION MATERIAL

(71) Applicant: SUMITOMO CHEMICAL COMPANY, LIMITED, Tokyo (JP)

(72) Inventors: Yuta Ishino, Osaka (JP); Tomoya Kashiki, Osaka (JP); Shohei Matsushita, Osaka (JP); Keiichi Kitamura, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 382 days.

(21) Appl. No.: 17/636,284

(22) PCT Filed: Aug. 20, 2020

(86) PCT No.: PCT/JP2020/031414
§ 371 (c)(1),
(2) Date: Feb. 17, 2022

(87) PCT Pub. No.: WO2021/039570
PCT Pub. Date: Mar. 4, 2021

(65) Prior Publication Data
US 2022/0310939 A1 Sep. 29, 2022

(30) Foreign Application Priority Data

Aug. 29, 2019 (JP) .................................. 2019-156908
Aug. 6, 2020 (JP) .................................. 2020-134079

(51) Int. Cl.
*H10K 85/30* (2023.01)
*H10K 30/00* (2023.01)

(52) U.S. Cl.
CPC ........... *H10K 85/341* (2023.02); *H10K 30/00* (2023.02)

(58) Field of Classification Search
CPC .... H10K 85/341; H10K 30/00; H10K 71/311; H10K 30/30; H10K 71/12; H10K 85/113; H10K 85/151
(Continued)

(56) References Cited

U.S. PATENT DOCUMENTS

2012/0073662 A1 3/2012 Swager et al.
2016/0017077 A1 1/2016 Lee et al.

FOREIGN PATENT DOCUMENTS

JP 2005-225953 A 8/2005
JP 2008091886 A * 4/2008
(Continued)

OTHER PUBLICATIONS

Japanese Office Action dated Mar. 2, 2022 issued in corresponding Japanese Application No. JP2020-134079.
(Continued)

*Primary Examiner* — Mohammad M Hoque
(74) *Attorney, Agent, or Firm* — Foley & Lardner LLP

(57) ABSTRACT

The present invention provides an organic photoelectric conversion material such that an increase in the solution viscosity can be suppressed even after long-term storage. This organic photoelectric conversion material comprises Pd, wherein the average number of Pd clusters in a scanning transmission electron microscopic image of a thin film made of the organic photoelectric conversion material is 1500 counts/$\mu m^3$ or less. It is preferable that the Pd clusters each have a particle diameter of from 1 nm to 20 nm. It is preferable that the organic photoelectric conversion material is a polymer for organic photoelectric conversion material; and it is more preferable that the polymer for organic photoelectric conversion material is a D-A type π-conjugated polymer. It is preferable that the polymer for organic photoelectric conversion material has a thiophene ring.

9 Claims, 8 Drawing Sheets

(58) Field of Classification Search
USPC .............................................. 257/40
See application file for complete search history.

(56) References Cited

FOREIGN PATENT DOCUMENTS

| JP | 2012-224618 A | | 11/2012 |
|---|---|---|---|
| JP | 2014-203849 A | | 10/2014 |
| JP | 2019-090656 A | | 6/2019 |
| KR | 20160149893 A | * | 12/2016 |
| WO | WO-2016/125822 A1 | | 8/2016 |

OTHER PUBLICATIONS

Japanese Office Action dated May 25, 2022 issued in corresponding Japanese Application No. JP2020-134079.
International Searching Authority, "International Search Report," in connection with International Patent Application No. PCT/JP2020/031414, dated Nov. 10, 2020.
International Searching Authority, "Written Opinion," in connection with International Patent Application No. PCT/JP2020/031414, dated Nov. 10, 2020.
European Extended Search Report issued in corresponding European Patent Application No. 20858652.9 dated Aug. 25, 2023 (7 pages).

* cited by examiner

200nm

200nm

200nm

200nm

200nm

200nm

ORGANIC PHOTOELECTRIC CONVERSION MATERIAL

CROSS-REFERENCE TO RELATED APPLICATIONS

The present application claims priority under 37 U.S.C. § 371 to International Patent Application No. PCT/JP2020/031414, filed Aug. 20, 2020, which claims priority to and the benefit of Japanese Patent Application Nos. 2019-156908, filed on Aug. 29, 2019, and 2020-134079, filed on Aug. 6, 2020. The contents of these applications are hereby incorporated by reference in their entireties.

TECHNICAL FIELD

The present invention relates to an organic photoelectric conversion material that can be used for an organic photoelectric conversion element, a method of producing a polymer for organic photoelectric conversion material, and an organic photoelectric conversion element.

BACKGROUND ART

Organic photoelectric conversion elements are attracting attention because the elements are each an extremely useful device from the viewpoint of, for instance, energy saving and reduction of carbon dioxide emissions.

The organic photoelectric conversion element is an electronic element including at least a pair of electrodes including an anode and a cathode, and an active layer provided between the pair of electrodes and containing an organic semiconductor material (organic photoelectric conversion material). In the organic photoelectric conversion element, one of the electrodes is made of a light-transmitting material, and light is incident on the active layer from the light-transmitting electrode side. Next, the energy (hν) of the light incident on the active layer generates electric charges (holes and electrons) in the active layer, the generated holes move toward the anode, and the electrons move toward the cathode. Then, the electric charges that reach the anode and the cathode are taken out to the outside of the organic photoelectric conversion element.

If the organic photoelectric conversion material used for such an organic photoelectric conversion element contains impurities, it may become a factor, etc., that hinders hole or electron conduction. Thus, a purification method for reducing impurities is being studied. For example, Patent Document 1 discloses a method of sublimating and purifying an organic material after setting the concentration of inorganic impurities in the organic material to 5000 ppm or less.

PRIOR ART DOCUMENTS

Patent Documents

Patent Document 1: JP-A-2012-224618

SUMMARY OF THE INVENTION

Problems to be Solved by the Invention

Meanwhile, a solution of organic photoelectric conversion material is applied and used. Thus, it is necessary to keep the solution viscosity constant without deterioration even after storage in a powder form for a certain period of time.

However, the present inventors have researched and found that when organic photoelectric conversion material powder produced by using a catalyst containing palladium (Pd), for example, is stored for a long period of time, the material deteriorates due to some factors; and that the viscosity increases when the post-storage powder is liquefied more than the pre-storage powder. This causes a problem. The viscosity of the solution greatly affects the coatability. Thus, there is a demand for an organic photoelectric conversion material, the viscosity of which does not easily change when the material is liquefied even if the material is powder stored for a predetermined period.

Therefore, the purpose of the invention is to provide an organic photoelectric conversion material such that an increase in the solution viscosity can be suppressed after long-term storage, a method of producing a polymer for organic photoelectric conversion material, and an organic photoelectric conversion element.

Means for Solving the Problems

As a result of intensive research to solve the above problems, the present inventors have found that the above problems can be solved by reducing the number of Pd clusters in the organic photoelectric conversion material to a predetermined value or less. Then, the present invention has been completed. Specifically, the present invention includes the following preferred embodiments.

[1] An organic photoelectric conversion material comprising Pd, wherein an average number of Pd clusters in a scanning transmission electron microscopic image of a thin film made of the organic photoelectric conversion material is 1500 counts/$\mu m^3$ or less.

[2] The organic photoelectric conversion material according to [1], wherein the Pd clusters each have a particle diameter of from 1 to 20 nm.

[3] The organic photoelectric conversion material according to [1] or [2], wherein the organic photoelectric conversion material is a polymer for organic photoelectric conversion material.

[4] The organic photoelectric conversion material according to [3], wherein the polymer for organic photoelectric conversion material is a D-A type π-conjugated polymer.

[5] The organic photoelectric conversion material according to [3] or [4], wherein the polymer for organic photoelectric conversion material has a thiophene ring.

[6] A method of producing a polymer for organic photoelectric conversion material containing Pd, comprising the step of:
  causing a solution of the polymer to contact a chelator at a temperature of 80° C. or higher, wherein
  an average number of Pd clusters in a scanning transmission electron microscopic image of a thin film made of the polymer for organic photoelectric conversion material is 1500 counts/$\mu m^3$ or less.

[7] The method according to [6], wherein a solvent in the polymer solution comprises an aromatic solvent.

[8] The method according to [6] or [7], wherein the chelator is an amine-based compound.

[9] An organic photoelectric conversion element comprising: a pair of electrodes including an anode and a cathode; and an active layer provided between the pair of electrodes and containing the organic photoelectric conversion material according to any one of [1] to [5].

Effect of the Invention

In an organic photoelectric conversion material of the invention, an increase in the solution viscosity of the mate-

MODE FOR CARRYING OUT THE INVENTION

[Organic Photoelectric Conversion Material]

Figure 1:
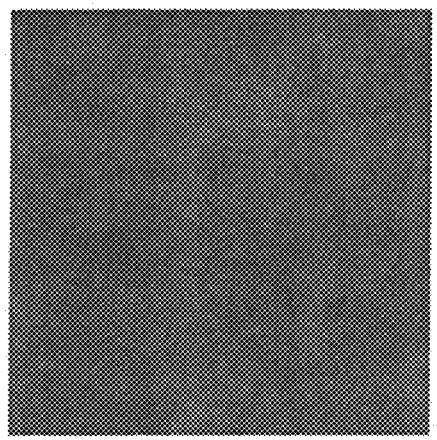
FIG. 1 is a STEM image (visual field 1) of the polymer thin film (E-1) in Example 1.

An organic photoelectric conversion material of the invention contains palladium (Pd). The average number of Pd clusters in a scanning transmission electron microscopic image (STEM image) of a thin film made of this organic photoelectric conversion material (sometimes referred to as an organic photoelectric conversion material thin film) is 1500 counts/$\mu m^3$ or less. Note that as used herein, each Pd cluster means an aggregate (compound) formed by gathering a plurality of Pd atoms. For example, 10 to 100 Pd atoms are assembled in one Pd cluster. Further, palladium (Pd) contained in the organic photoelectric conversion material means to include a Pd atom, a Pd atom(s) in a Pd cluster, a Pd atom(s) in, for example, a palladium-containing compound.

The present inventors have found that when a predetermined number or more of Pd clusters are present in a Pd-containing organic photoelectric conversion material (preferably a polymer for organic conversion material), the organic photoelectric conversion material deteriorates over time and the solution viscosity of the organic photoelectric conversion material after storage increases. According to the results of theoretical quantum calculation (see Example 4), when a Pd cluster coordinates with the organic photoelectric conversion material, charge transfer from the organic photoelectric conversion material to the Pd cluster occurs, causing an increase in the charge (positive charge) of the organic photoelectric conversion material. In particular, the presence of oxygen promotes the charge transfer. Thus, it is presumed that if the organic photoelectric conversion material is stored for a long period of time, the organic photoelectric conversion materials tend to aggregate with one another, and the solution viscosity of the organic photoelectric conversion material increases. In the invention, the number of Pd clusters in the organic photoelectric conversion material is equal to or less than a predetermined value, that is, the average number of Pd clusters in a STEM image of the organic photoelectric conversion material thin film is 1500 counts/$\mu m^3$ or less. Thus, even if the Pd-containing organic photoelectric conversion material is stored for a long period of time, the charge increase and aggregation of the organic photoelectric conversion material are unlikely to occur, and an increase in the solution viscosity can be suppressed or prevented. Note that as used herein, deterioration of the organic photoelectric conversion material means to include an increase in the electric charge of the organic photoelectric conversion material and a tendency for occurrence of aggregation of the organic photoelectric conversion material.

(Pd Cluster)

As used herein, the number of Pd clusters in the organic photoelectric material is evaluated by the average number of Pd clusters (white spots) in a STEM image of the organic photoelectric conversion material thin film. The organic photoelectric conversion material thin film is obtained by applying a solution, in which an organic photoelectric conversion material is dissolved in a solvent, onto a substrate to form a film.

The solution of the organic photoelectric conversion material can be prepared by, for instance, stirring and mixing the organic photoelectric conversion material and a solvent. The solvent is not particularly limited as long as the solvent makes the organic photoelectric conversion material applicable. For example, the solvent can be selected, if appropriate, from the solvents described in the Section [Method of Producing Polymer for Organic Photoelectric Conversion Material].

The solution concentration of the organic photoelectric conversion material can be selected, if appropriate, according to the solubility of the organic photoelectric conversion material into the solvent and the film thickness. For example, the solution concentration is from 0.01 to 10 mass %, preferably from 0.01 to 5 mass %, and more preferably from 0.1 to 5 mass %. The solution concentration of the organic photoelectric conversion material indicates the mass of the organic photoelectric conversion material based on the mass of the solution.

Examples of the substrate include, but are not particularly limited to, glass; a polyester resin (e.g., polyethylene terephthalate (PET)); a polyolefin resin (e.g., polyethylene (PE), polypropylene (PP), cyclic polyolefin); a polyamide resin; a polyimide resin; a polycarbonate resin; a polystyrene resin; a polyvinyl alcohol resin; a polyacrylonitrile resin; an acetal resin; a polyimide resin; or a polythiophene resin.

Examples of the application procedure include slit coating, knife coating, spin coating, micro gravure coating, gravure coating, bar coating, inkjet printing, nozzle coating, or capillary coating.

After the solution is applied onto the substrate, drying may be conducted to form a thin film. The thickness of the thin film is preferably from 1 nm to 100 μm and more preferably from 2 nm to 1000 nm.

The average number of Pd clusters in a STEM image of the organic photoelectric conversion material thin film is 1500 counts/μm$^3$ or less, preferably 1200 counts/μm$^3$ or less, more preferably 1000 counts/μm$^3$ or less, still more preferably 500 counts/μm$^3$ or less, particularly preferably 300 counts/μm$^3$ or less, more particularly preferably 150 counts/μm$^3$ or less, and most preferably 100 counts/μm$^3$ or less. When the average number of Pd clusters is the above upper limit or less, deterioration of the organic photoelectric conversion material over time can be suppressed, so that it is easy to effectively suppress an increase in the solution viscosity after storage. The lower limit of the average number of Pd clusters in a STEM image of the organic photoelectric conversion material thin film is not particularly limited, and is 0 counts/μm$^3$ or more. Note that the average number of Pd clusters in a STEM image of the organic photoelectric conversion material thin film can be determined by, for example, the following procedure. First, a scanning electron microscope (TEM) is used for measurement with a scanning transmission electron microscope (STEM) to obtain STEM images for three visual fields. The number of white spots (Pd clusters) that appear in each visual field of the STEM images is recorded. Next, the area of the thin film corresponding to one visual field of the STEM image is multiplied by the film thickness to give a product. The value obtained by dividing the number of Pd clusters in one visual field by the above product is defined as the number of Pd clusters per μm$^3$ (counts/μm$^3$). The numbers of Pd clusters (counts/μm$^3$) for three visual fields are averaged to give the average number of Pd clusters (counts/μm$^3$) for three visual fields. The average number of Pd clusters (counts/μm$^3$) can be calculated by, for example, the procedure described in Examples.

In one embodiment of the invention, the particle diameter of each Pd cluster is preferably 1 nm or larger, more preferably 2 nm or larger and preferably 20 nm or less, and more preferably 10 nm or less. When the particle diameter of each Pd cluster is in the above range, charge transfer to the Pd cluster tends to occur because the frontier orbitals of the Pd cluster and the organic photoelectric conversion material become closer. Also, the organic photoelectric conversion material tends to deteriorate easily. Thus, if the number of Pd clusters is controlled to a predetermined value or less, an effect of suppressing the viscosity according to the invention is likely to be exerted. Note that the particle diameter of each Pd cluster can be obtained, for example, by measuring the diameter of each white spot (Pd cluster) appearing in a STEM image.

(Polymer for Organic Photoelectric Conversion Material)

The organic photoelectric conversion material is preferably a polymer for organic photoelectric conversion material. The polymer for organic photoelectric conversion material is not particularly limited as long as the polymer can be used as an organic photoelectric conversion material. However, a π-conjugated polymer is preferable because of excellent organic photoelectric conversion performance.

In addition, the polymer for organic photoelectric conversion material, especially a π-conjugated polymer, tends to be depleted of electrons by Pd clusters (in particular, Pd clusters and oxygen). Thus, when stored for a long period of time, the polymer is likely to aggregate due to an increase in the charge, and the solution viscosity after storage tends to increase. Accordingly, when the organic photoelectric conversion material is a polymer for organic photoelectric conversion material, particularly a π-conjugated polymer, the viscosity suppressing effect of the invention is likely to be exerted by controlling the number of Pd clusters to a predetermined value or less.

Hereinafter, terms commonly used will be described in order to more specifically explain the polymer for organic photoelectric conversion material.

As used herein, the "structural unit" means one or more unit structures present in the polymer for organic photoelectric conversion material. The "structural unit" is preferably included as a "repeating unit" (two or more unit structures present in the polymer for organic photoelectric conversion material).

The "hydrogen atom" may be a light hydrogen atom or a deuterium atom.

The "halogen atom" includes a fluorine atom, a chlorine atom, a bromine atom, or an iodine atom.

The wording "optionally substituted" means to include two cases where all the hydrogen atoms constituting a compound or group are unsubstituted, or part or all of one or more hydrogen atoms are substituted by a substituent(s).

Unless otherwise specified, the "alkyl group" may be linear, branched, or cyclic. The number of carbon atoms of the linear alkyl group is usually from 1 to 50, preferably from 1 to 30, and more preferably from 1 to 20, excluding the number of carbon atoms of its substituent(s). The number of carbon atoms of the branched or cyclic alkyl group is usually from 3 to 50, preferably from 3 to 30, and more preferably from 4 to 20, excluding the number of carbon atoms of its substituent(s).

The alkyl group is optionally substituted. Specific examples of the alkyl group include an alkyl group (e.g., a methyl group, ethyl group, n-propyl group, isopropyl group, n-butyl group, isobutyl group, tert-butyl group, n-pentyl group, isoamyl group, 2-ethylbutyl group n-hexyl group, cyclohexyl group, n-heptyl group, cyclohexylmethyl group, cyclohexylethyl group, n-octyl group, 2-ethylhexyl group, 3-n-propylheptyl group, adamantyl group, n-decyl group, 3,7-dimethyloctyl group, 2-ethyloctyl group, 2-n-hexyldecyl group, n-dodecyl group, tetradecyl group, hexadecyl group, octadecyl group, eicosyl group); or a substituted alkyl group (e.g., a trifluoromethyl group, pentafluoroethyl group, perfluorobutyl group, perfluorohexyl group, perfluorooctyl group, 3-phenylpropyl group, 3-(4-methylphenyl)propyl group, 3-(3,5-di-n-hexylphenyl)propyl group, 6-ethyloxyhexyl group).

The "aryl group" means the remaining atomic group obtained by removing, from an optionally substituted aromatic hydrocarbon, one hydrogen atom directly bonded to a carbon atom constituting the ring.

The aryl group is optionally substituted. Specific examples of the aryl group include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, 2-fluorenyl group, 3-fluorenyl group, 4-fluorenyl group, 2-phenylphenyl group, 3-phenylphenyl group, 4-phenylphenyl group, or those substituted with an alkyl group, an alkoxy group, an aryl group, a fluorine atom, or the like.

The "alkoxy group" may be linear, branched, or cyclic. The number of carbon atoms of the linear alkoxy group is usually from 1 to 40 and preferably from 1 to 10, excluding the number of carbon atoms of its substituent(s). The number of carbon atoms of the branched or cyclic alkoxy group is usually form 3 to 40 and preferably 4 to 10, excluding the number of carbon atoms of its substituent(s).

The alkoxy group is optionally substituted. Specific examples of the alkoxy group include a methoxy group, an ethoxy group, an n-propyloxy group, an isopropyloxy group, an n-butyloxy group, an isobutyloxy group, a tert-butyloxy group, an n-pentyloxy group, an n-hexyloxy group, a cyclohexyloxy group, an n-heptyloxy group, an n-octyloxy group, a 2-ethylhexyloxy group, an n-nonyloxy group, an n-decyloxy group, a 3,7-dimethyloctyloxy group, or a lauryloxy group.

The number of carbon atoms of the "aryloxy group" is usually from 6 to 60 and preferably from 6 to 48, excluding the number of carbon atoms of its substituent(s).

The aryloxy group is optionally substituted. Specific examples of the aryloxy group include a phenoxy group, a 1-naphthyloxy group, a 2-naphthyloxy group, a 1-anthracenyloxy group, a 9-anthracenyloxy group, a 1-pyrenyloxy group, or those substituted with an alkyl group, an alkoxy group, a fluorine atom, or the like.

The "alkylthio group" may be linear, branched, or cyclic. The number of carbon atoms of the linear alkylthio group is usually from 1 to 40, preferably 1 to 10, excluding the number of carbon atoms of its substituent(s). The number of carbon atoms of the branched and cyclic alkylthio groups is usually from 3 to 40 and preferably 4 to 10, excluding the number of carbon atoms of its substituent(s).

The alkylthio group is optionally substituted. Specific examples of the alkylthio group include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group, or a trifluoromethylthio group.

The number of carbon atoms of the "arylthio group" is usually from 6 to 60 and preferably from 6 to 48, excluding the number of carbon atoms of its substituent(s).

The arylthio group is optionally substituted. Examples of the arylthio group include a phenylthio group and a C1-C12 alkyloxyphenylthio group (here, "C1-C12" indicates that the group described immediately after that has 1 to 12 carbon atoms. The same applies to the following), a C1-C12 alkylphenylthio group, a 1-naphthylthio group, a 2-naphthylthio group, or a pentafluorophenylthio group.

A "p-valent heterocyclic group" (p represents an integer of 1 or more) means the remaining atomic group obtained by removing, from an optionally substituted heterocyclic compound, p hydrogen atoms directly bonded to a carbon atom(s) or a heteroatom(s) constituting the ring. Among the p-valent heterocyclic groups, a "p-valent aromatic heterocyclic group" is preferable. The "p-valent aromatic heterocyclic group" means the remaining atomic group obtained by removing, from an optionally substituted aromatic heterocyclic compound, p hydrogen atoms directly bonded to a carbon atom(s) or a heteroatom(s) constituting the ring.

Here, examples of a substituent optionally included in the heterocyclic compound include a halogen atom, an alkyl group, an aryl group, an alkoxy group, an aryloxy group, an alkylthio group, an arylthio group, a monovalent heterocyclic group, a substituted amino group, an acyl group, an imine residue, an amido group, an acidimido group, a substituted oxycarbonyl group, an alkenyl group, an alkynyl group, a cyano group, or a nitro group.

Examples of the aromatic heterocyclic compound include, in addition to each compound in which the heterocycle itself exhibits aromaticity, each compound in which the aromatic ring is fused to a heterocycle which does not exhibit aromaticity.

Among the aromatic heterocyclic compounds, specific examples of the compound in which the heterocycle itself exhibits aromaticity include oxadiazole, thiadiazole, thiazole, oxazole, thiophene, pyrrole, phosphole, furan, pyridine, pyrazine, pyrimidine, triazine, pyridazine, quinoline, isoquinolin, carbazole, or dibenzophosphole.

Among the aromatic heterocyclic compounds, specific examples of the compound in which an aromatic ring is fused to a heterocycle that does not exhibit aromaticity include phenoxazine, phenothiazine, dibenzoborole, dibenzosilole, or benzopyran.

The number of carbon atoms of the monovalent heterocyclic group is usually from 2 to 60 and preferably from 4 to 20 excluding the number of carbon atoms of its substituent(s).

The monovalent heterocyclic group is optionally substituted, and specific examples of the monovalent heterocyclic group include a thienyl group, a pyrrolyl group, a furyl group, a pyridyl group, a piperidyl group, a quinolyl group, an isoquinolyl group, a pyrimidinyl group, a triazinyl group, or those substituted with an alkyl group, an alkoxy group, or the like.

The "substituted amino group" means an amino group having a substituent. Examples of a substituent that the substituted amino group can have include an alkyl group, an aryl group, or a monovalent heterocyclic group. As the substituent, an alkyl group, an aryl group, or a monovalent heterocyclic group is preferable. The number of carbon atoms of the substituted amino group is usually from 2 to 30.

Examples of the substituted amino group include a dialkylamino group (e.g., a dimethylamino group, a diethylamino group) or a diarylamino group (e.g., a diphenylamino group, a bis(4-methylphenyl)amino group, a bis(4-tert-butylphenyl)amino group, a bis(3,5-di-tert-butylphenyl) amino group).

The "acyl group" usually has 2 to 20 carbon atoms and preferably 2 to 18 carbon atoms. Specific examples of the acyl group include an acetyl group, a propionyl group, a butyryl group, an isobutyryl group, a pivaloyl group, a benzoyl group, a trifluoroacetyl group, or a pentafluorobenzoyl group.

The "imine residue" means the remaining atomic group obtained by removing, from an imine compound, one hydrogen atom directly bonded to a carbon atom or a nitrogen atom forming a carbon atom-nitrogen atom double bond. The "imine compound" means an organic compound having a carbon atom-nitrogen atom double bond in the molecule. Examples of the imine compound include each compound in which the hydrogen atom bonded to a nitrogen atom constituting a carbon atom-nitrogen atom double bond in aldimine, ketimine, or aldimine is substituted with an alkyl group or the like.

The imine residue has usually 2 to 20 carbon atoms and preferably 2 to 18 carbon atoms. Examples of the imine residue include each group represented by the following structural formulas.

[Chem. 1]

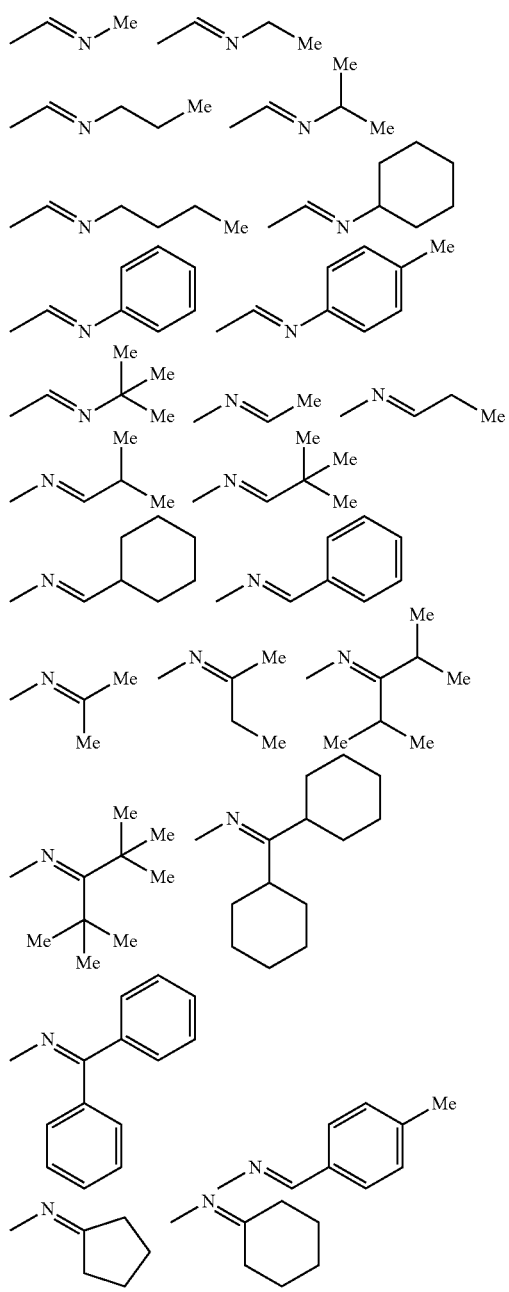

The "amido group" means the remaining atomic group obtained by removing, from an amide, one hydrogen atom bonded to a nitrogen atom. The number of carbon atoms of the amido group is usually from 1 to 20 and preferably from 1 to 18. Specific examples of the amido group include a formamido group, an acetamido group, a propioamido group, a butyroamido group, a benzamido group, a trifluoroacetamido group, a pentafluorobenzamido group, a diformamido group, a diacetamido group, a dipropioamido group, a dibutyroamido group, a dibenzamido group, a ditrifluoroacetamido group, or a dipentafluorobenzamido group.

The "acidimido group" means the remaining atomic group obtained by removing, from an acidimide, one hydrogen atom bonded to a nitrogen atom. The number of carbon atoms of the acidimido group is usually from 4 to 20. Specific examples of the acidimido group include each group represented by the following structural formulas.

[Chem. 2]

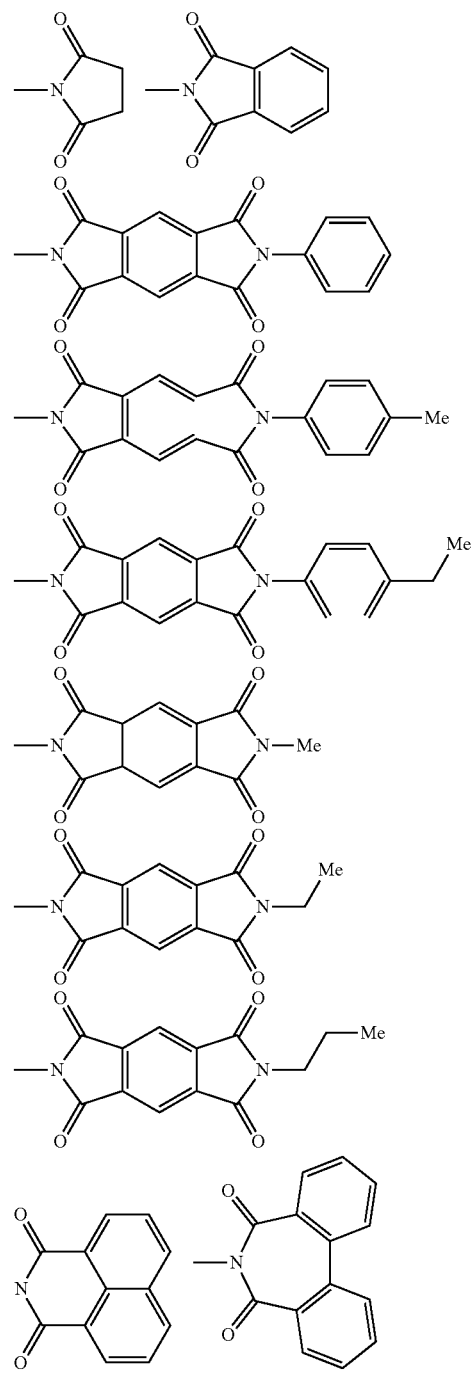

The "substituted oxycarbonyl group" means a group represented by R'—O—(C=O)—.

Here, R' represents an alkyl group, an aryl group, an arylalkyl group, or a monovalent heterocyclic group.

The substituted oxycarbonyl group has usually 2 to 60 carbon atoms and preferably 2 to 48 carbon atoms.

Specific examples of the substituted oxycarbonyl group include a methoxycarbonyl group, an ethoxycarbonyl group, a propoxycarbonyl group, an isopropoxycarbonyl group, a butoxycarbonyl group, an isobutoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, or a pyridyloxycarbonyl group.

The "alkenyl group" may be linear, branched, or cyclic. The number of carbon atoms of the linear alkenyl group is usually from 2 to 30 and preferably from 3 to 20 excluding the number of carbon atoms of its substituent(s). The number of carbon atoms of the branched or cyclic alkenyl group is usually from 3 to 30 and preferably from 4 to 20 excluding the number of carbon atoms of its substituent(s).

The alkenyl group is optionally substituted. Specific examples of the alkenyl group include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, or those substituted with an alkyl group, an alkoxy group, or the like.

The "alkynyl group" may be linear, branched, or cyclic. The number of carbon atoms of the linear alkynyl group is usually from 2 to 20 and preferably from 3 to 20 excluding the number of carbon atoms of its substituent(s). The number of carbon atoms of the branched or cyclic alkynyl group is usually from 4 to 30 and preferably from 4 to 20 excluding the number of carbon atoms of its substituent(s).

The alkynyl group is optionally substituted. Specific examples of the alkynyl group include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, or those substituted with an alkyl group, an alkoxy group, or the like.

Examples of the polymer for organic photoelectric conversion material include: polyvinylcarbazole or a derivative thereof; polysilane or a derivative thereof; a polysiloxane derivative containing an aromatic amine structure in the side chain or main chain; polyaniline or a derivative thereof; polythiophene or a derivative thereof; polypyrrole or a derivative thereof; polyphenylene vinylene or a derivative thereof; polythienylene vinylene or a derivative thereof; or polyfluorene or a derivative thereof.

The polymer for organic photoelectric conversion material may be any kind of copolymer such as a block copolymer, a random copolymer, an alternating copolymer, or a graft copolymer.

From the viewpoint of having excellent photoelectric conversion performance and easily and effectively suppressing an increase in viscosity after storage, the polymer for organic photoelectric conversion material preferably contains a structural unit represented by formula (I) below and/or formula (II) below.

[Chem. 3]

(I)

In formula (I), $Ar^1$ and $Ar^2$ each represent a trivalent aromatic heterocyclic group, and Z represents a group represented by any one of formulas (Z-1) to (Z-7) below.

[Chem. 4]

$$—Ar^3—$$ (II)

In formula (II), $Ar^3$ represents a divalent aromatic heterocyclic group.

[Chem. 5]

 (Z-1)

 (Z-2)

 (Z-3)

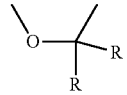 (Z-4)

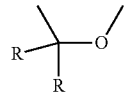 (Z-5)

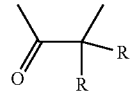 (Z-6)

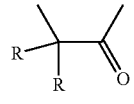 (Z-7)

In formulas (Z-1) to (Z-7), R represents a hydrogen atom, a halogen atom, an alkyl group, an aryl group, an alkoxy group, an aryloxy group, an alkylthio group, an arylthio group, a monovalent heterocyclic group, a substituted amino group, an acyl group, an imine residue, an amido group, an acidimido group, a substituted oxycarbonyl group, an alkenyl group, an alkynyl group, a cyano group, or a nitro group. When there are two R moieties in any one of the formulas (Z-1) to (Z-7), the two R moieties may be the same or different from each other.

The structural unit represented by formula (I) is preferably the structural unit represented by the following formula (I-1).

[Chem. 6]

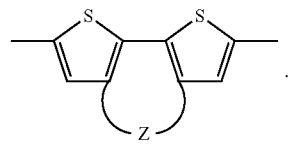 (I-1)

In formula (I-1), Z has the same meaning as described above.

Examples of the structural unit represented by formula (I-1) include each structural unit represented by the following formulas (501) to (506).

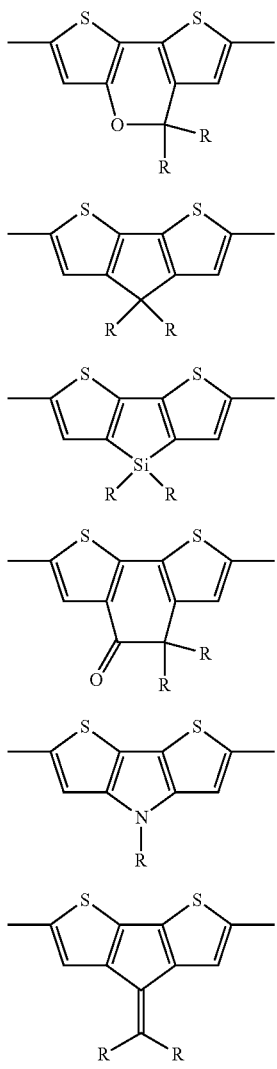

In the above formulas (501) to (506), R has the same meaning as described above. If there are two R moieties, the two R moieties may be the same or different from each other.

The number of carbon atoms contained in the divalent aromatic heterocyclic group represented by Ar³ is usually from 2 to 60, preferably from 4 to 60, and more preferably from 4 to 20. The divalent aromatic heterocyclic group represented by Ar³ is optionally substituted. Examples of a substituent that the divalent aromatic heterocyclic group represented by Ar³ may have include a halogen atom, an alkyl group, an aryl group, an alkoxy group, an aryloxy group, an alkylthio group, an arylthio group, a monovalent heterocyclic group, a substituted amino group, an acyl group, an imine residue, an amido group, an acidimido group, a substituted oxycarbonyl group, an alkenyl group, an alkynyl group, a cyano group, or a nitro group.

Examples of the divalent aromatic heterocyclic group represented by Ar³ include each group represented by the following formulas (101) to (185).

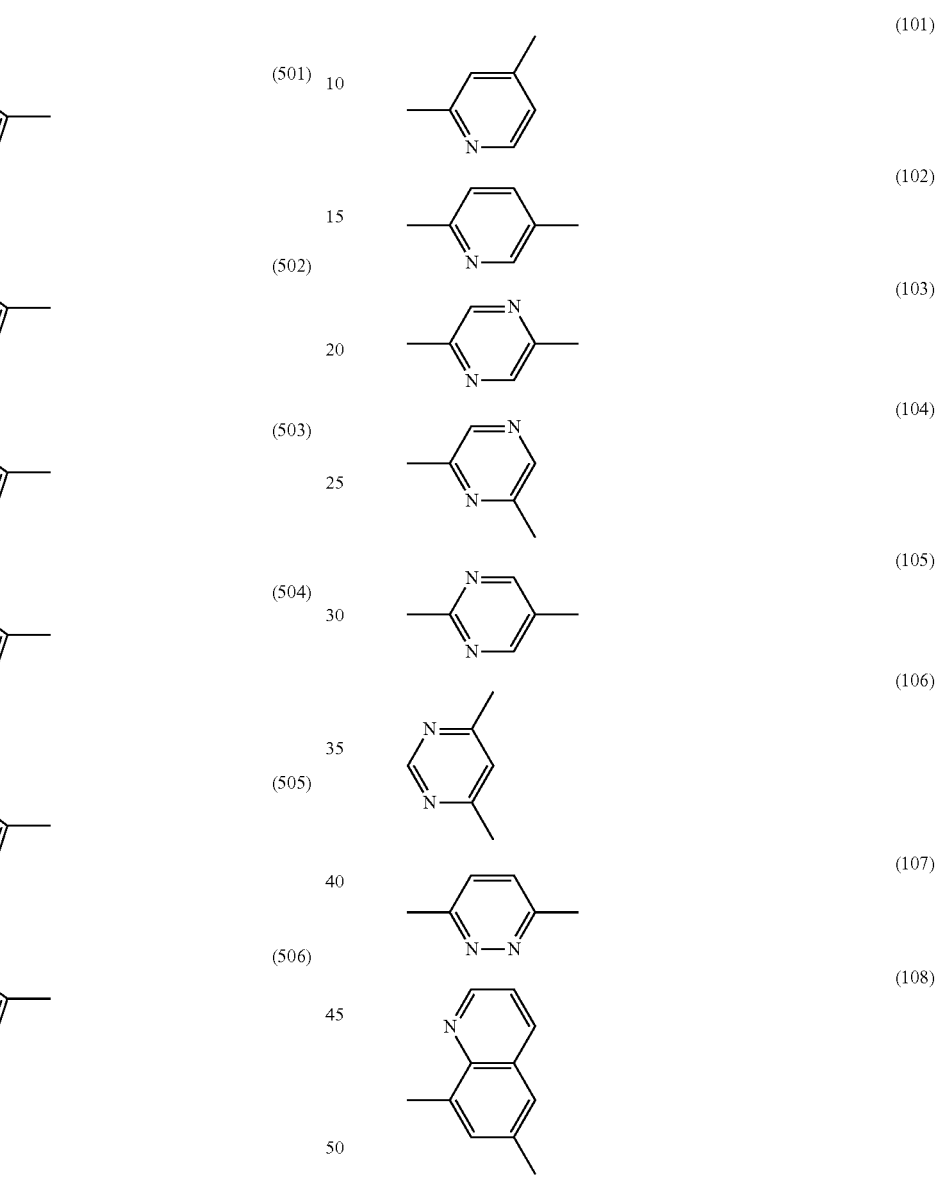

-continued
(111) 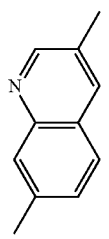
(112) 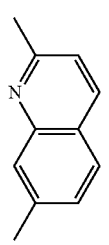
(113) 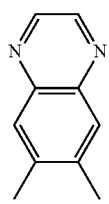
(114) 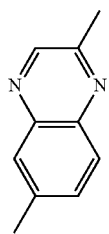
(115) 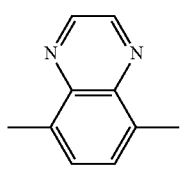
[Chem. 9]
(116) 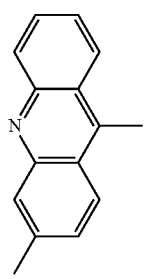
-continued
(117) 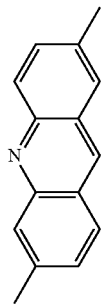
(118) 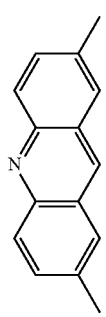
(119) 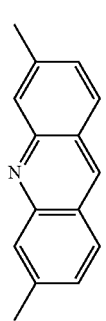
(120) 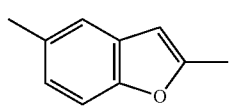
(121) 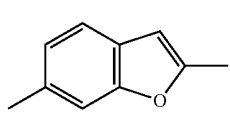
(122) 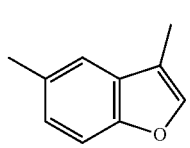
(123) 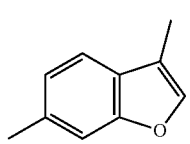
(124) 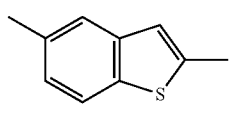

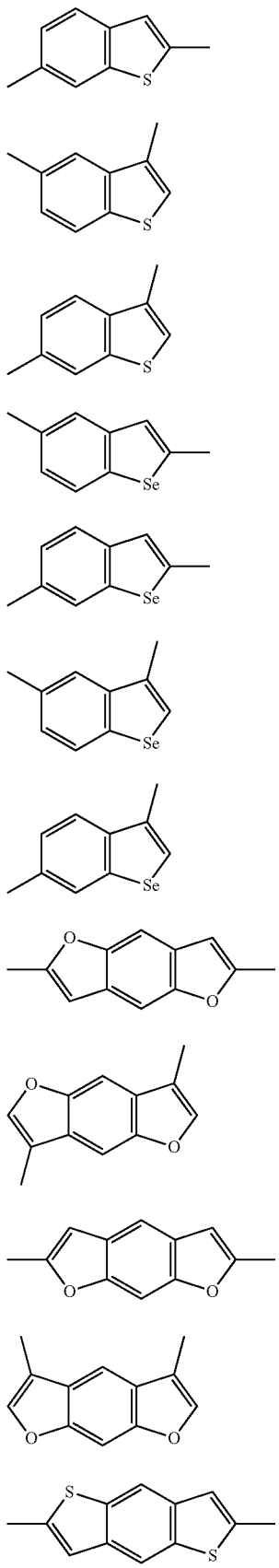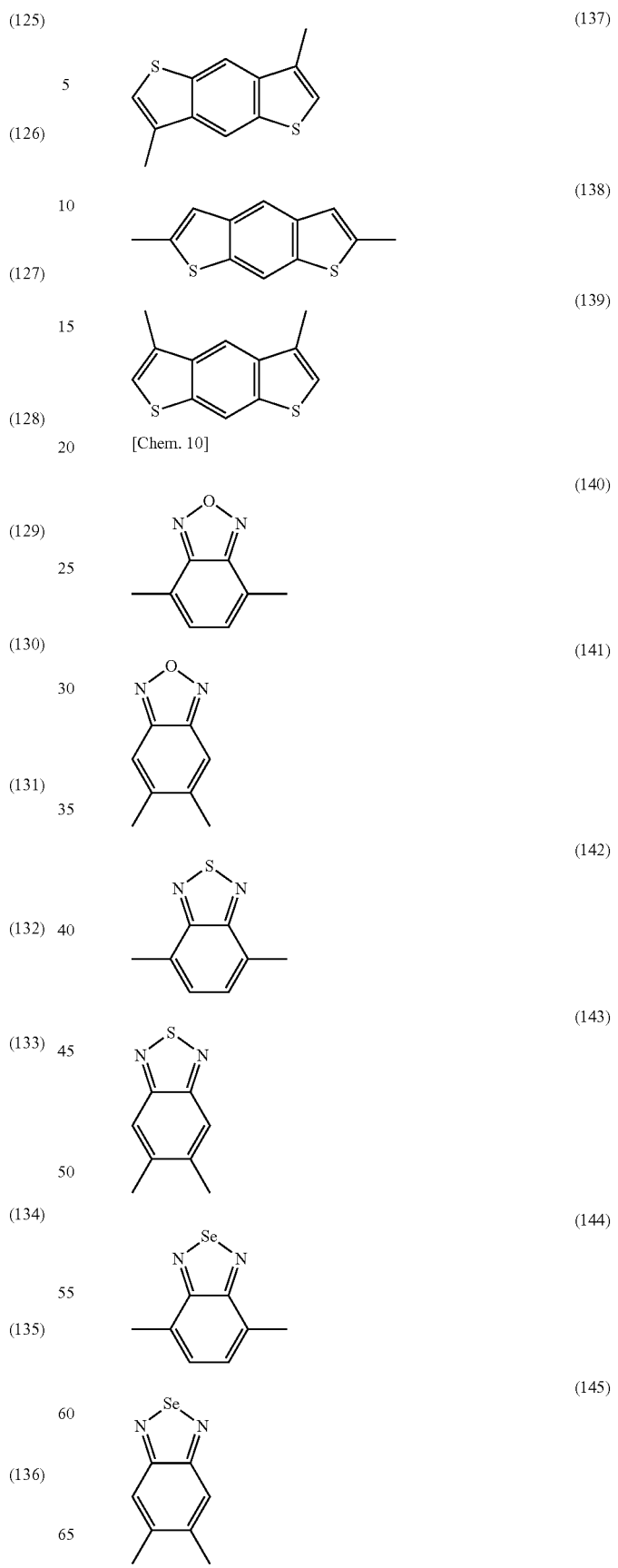

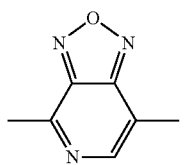
(146)
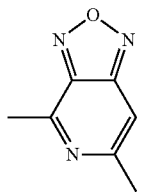
(147)
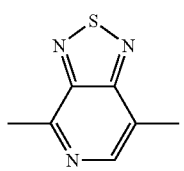
(148)
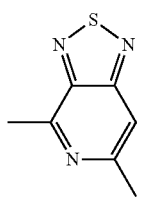
(149)
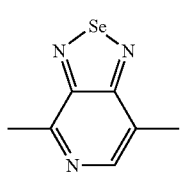
(150)
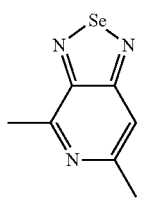
(151)
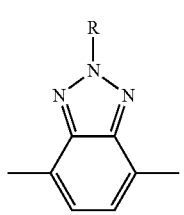
(152)
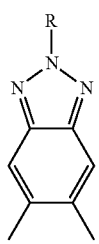
(153)
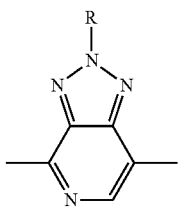
(154)
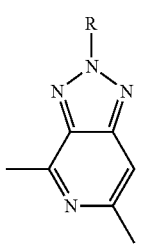
(155)
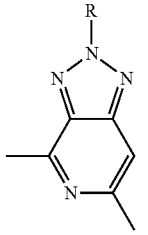
(156)
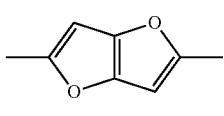
(157)
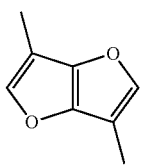
(158)
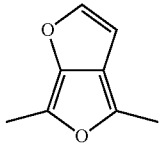
(159)
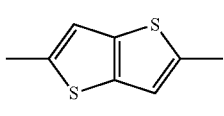
(160)
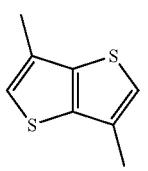
(161)
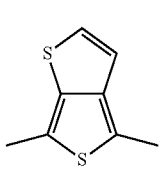
(162)
(163)

-continued
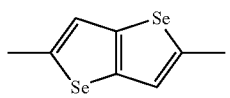 (164)
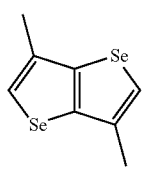 (165)
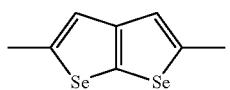 (166)
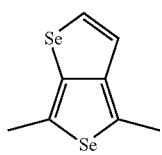 (167)
[Chem. 11]
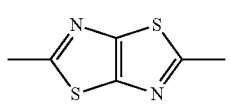 (168)
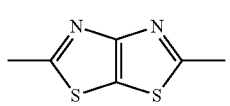 (169)
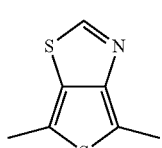 (170)
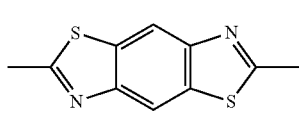 (171)
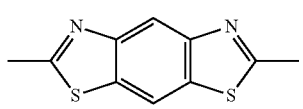 (172)
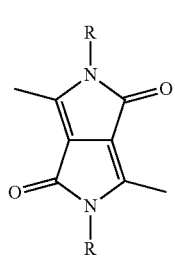 (173)
-continued
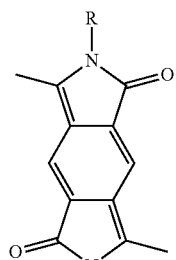 (174)
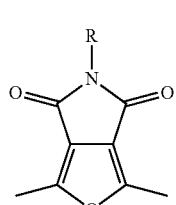 (175)
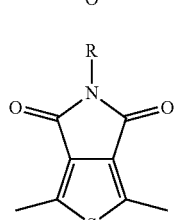 (176)
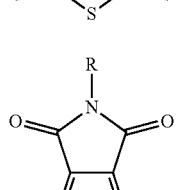 (177)
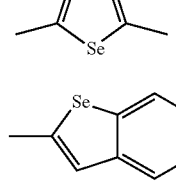 (178)
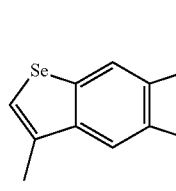 (179)
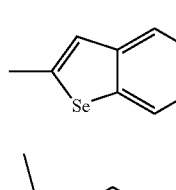 (180)
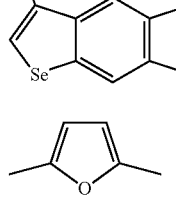 (181)
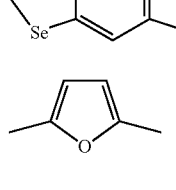 (182)

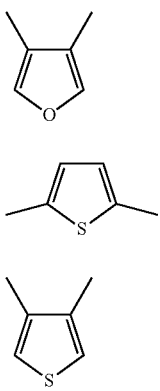

(183)

(184)

(185)

In formulas (101) to (185), R has the same meaning as described above. When there are a plurality of R moieties, the plurality of R moieties may be the same or different from one another.

The structural unit represented by the above formula (II) is preferably each structural unit represented by the following formulas (II-1) to (II-6).

[Chem. 12]

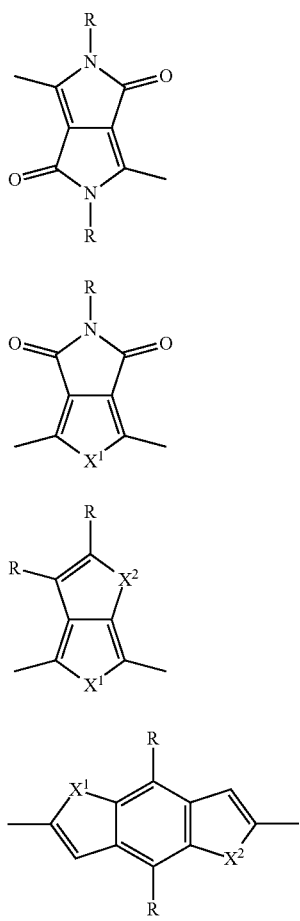

(II-1)

(II-2)

(II-3)

(II-4)

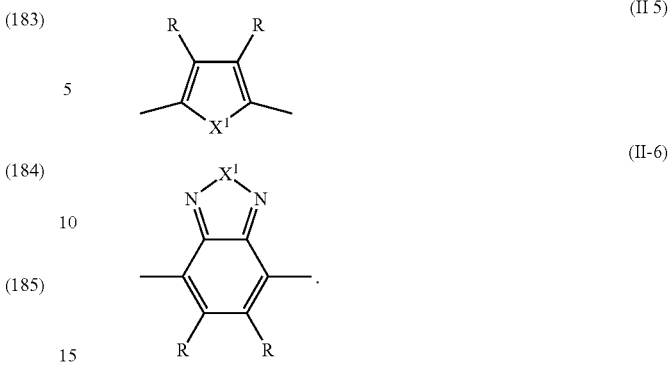

(II-5)

(II-6)

In formulas (II-1) to (11-6), $X^1$ and $X^2$ each independently represent an oxygen atom or a sulfur atom, and R has the same meaning as described above. When there are a plurality of R moieties, the plurality of R moieties may be the same or different from one another.

Since their raw material compound is readily available, both $X^1$ and $X^2$ in formulas (II-1) to (II-6) are preferably sulfur atoms.

The polymer for organic photoelectric conversion material may contain two or more kinds of structural units of formula (I), and may contain two or more kinds of the structural units of formula (II).

To improve the solubility in a solvent, the polymer for organic photoelectric conversion material may contain a structural unit represented by the following formula (III).

[Chem. 13]

—Ar⁴—  (III)

In formula (III), $Ar^4$ represents an arylene group.

The arylene group represented by $Ar^4$ means the remaining atomic group obtained by removing, from an optionally substituted aromatic hydrocarbon, two hydrogen atoms. Examples of the aromatic hydrocarbon also include a condensed ring-containing compound or each compound in which two or more rings selected from the group consisting of independent benzene rings and condensed rings are bonded directly or via a divalent group such as vinylene.

Examples of a substituent that the aromatic hydrocarbon may have include the same substituents as those mentioned above as the substituents that the heterocyclic compound may have.

The number of carbon atoms in the portion of the arylene group excluding the substituent(s) is usually from 6 to 60 and preferably from 6 to 20. The number of carbon atoms of the arylene group including the substituent(s) is usually from about 6 to 100.

Examples of the arylene group include a phenylene group (e.g., the following formulas 1 to 3), a naphthalene-diyl group (e.g., the following formulas 4 to 13), an anthracene-diyl group (e.g., the following formulas 14 to 19), a biphenyl-diyl group (e.g., the following formulas 20 to 25), a terphenyl-diyl group (e.g., the following formulas 26 to 28), a condensed ring compound group (e.g., the following formulas 29 to 35), a fluorene-diyl group (e.g., the following formulas 36 to 38), or a benzofluorene-diyl group (e.g., the following formulas 39 to 46).

[Chem. 14]
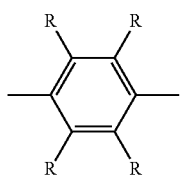
1
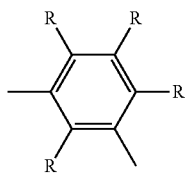
2
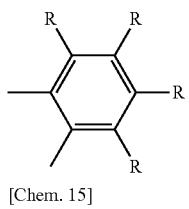
3
[Chem. 15]
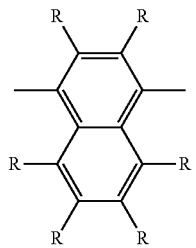
4
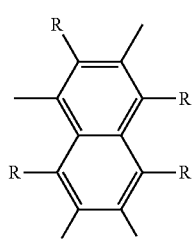
5
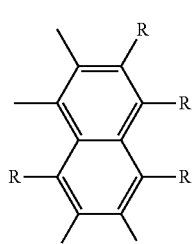
6
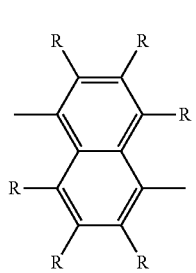
7
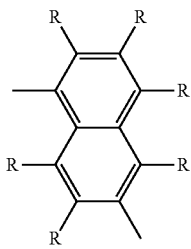
8
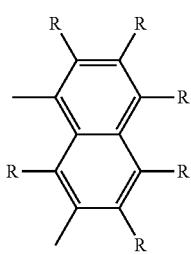
9
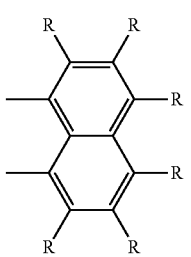
10
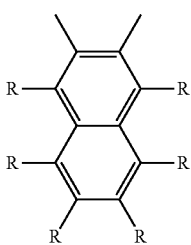
11
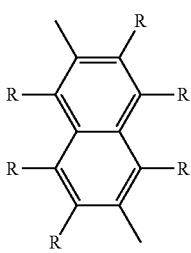
12
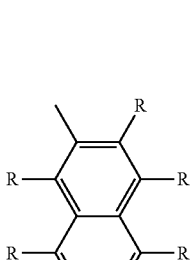
13

[Chem. 16]
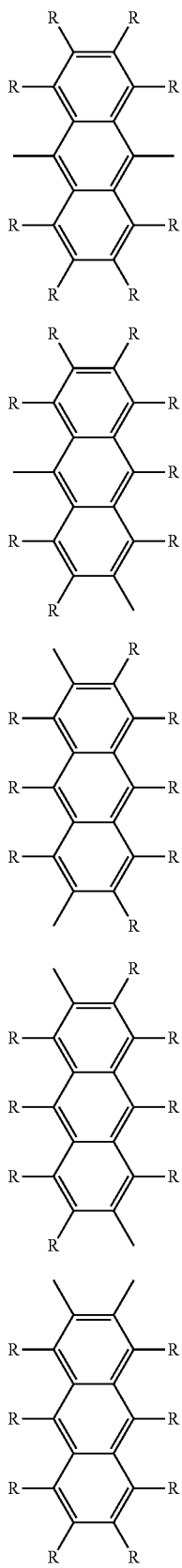
14
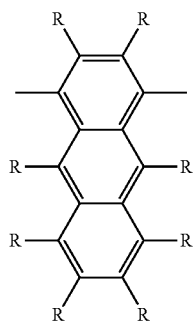
[Chem. 17]
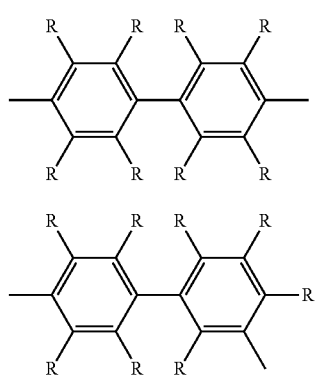
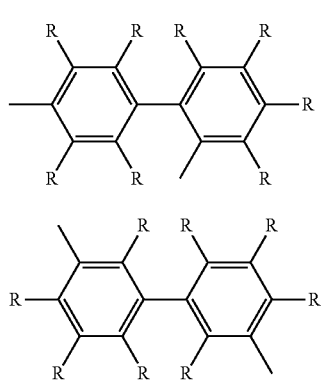
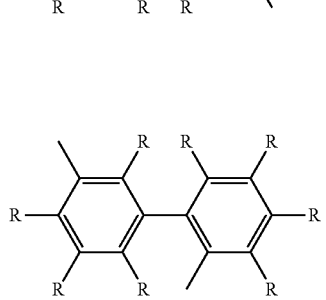
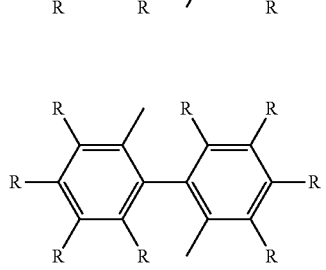

-continued
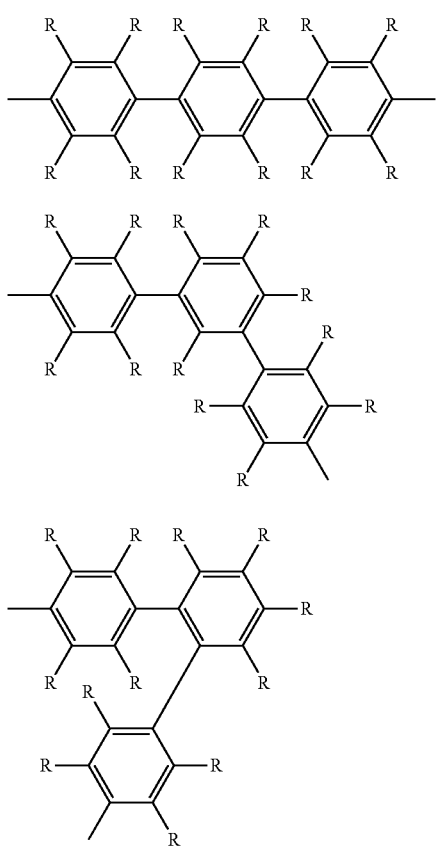
[Chem. 19]
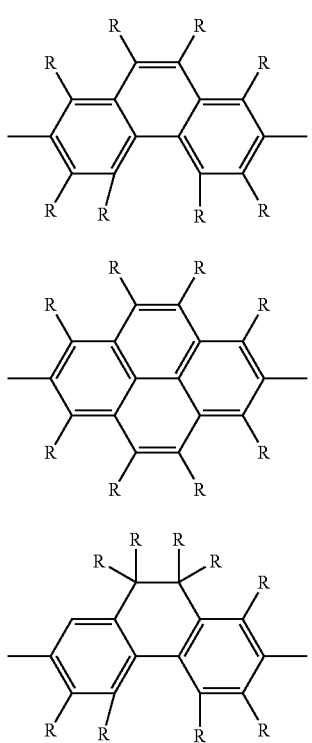
-continued
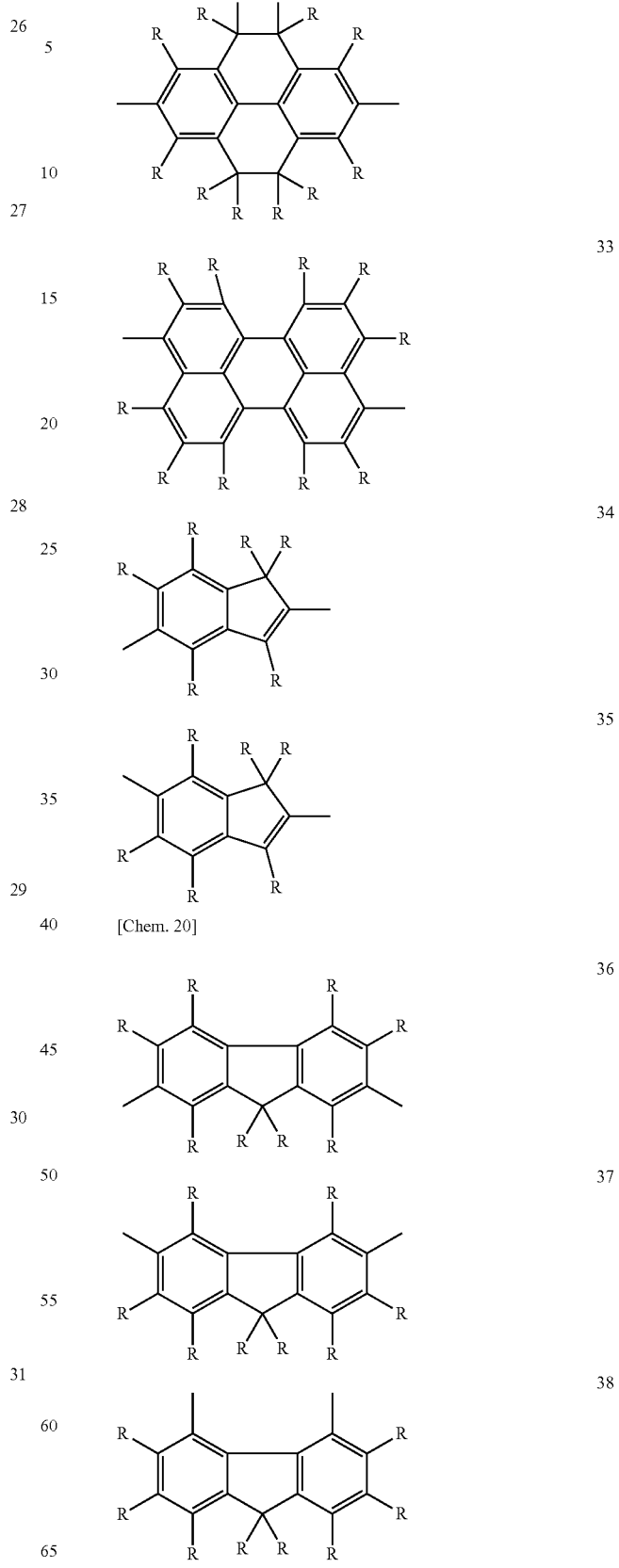
[Chem. 20]

-continued

[Chem. 21]

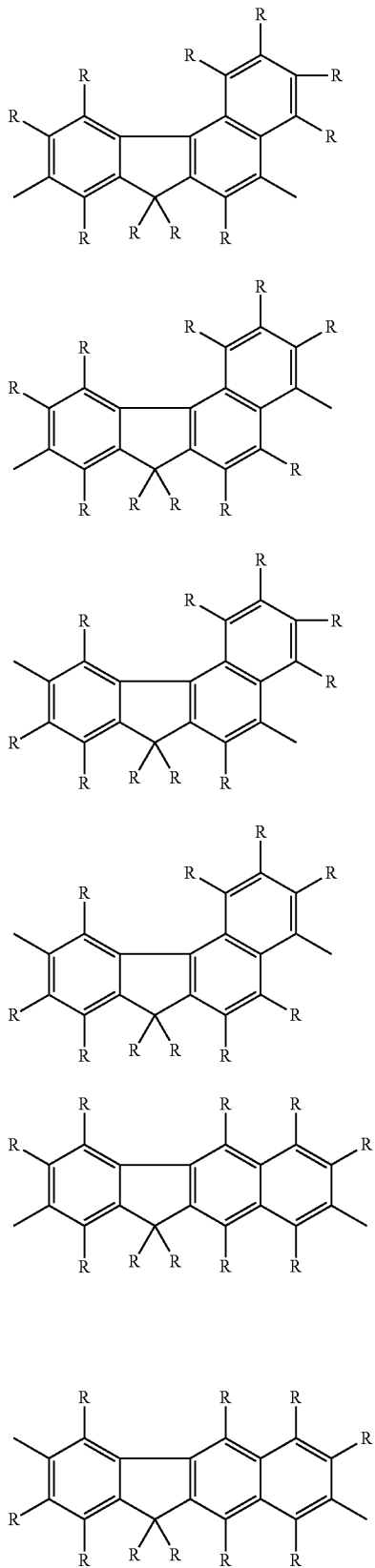

39
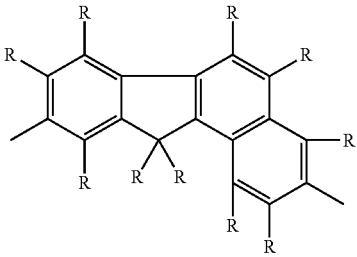

40
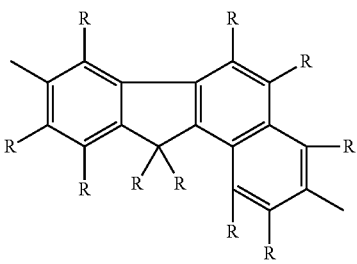

41

42

43

44

45

46

In one embodiment of the invention, the polymer for organic photoelectric conversion material is preferably a D-A type (donor-acceptor type) π-conjugated polymer. The D-A type π-conjugated polymer means a polymer containing both an electron donor site and an electron acceptor site in the molecule. Such a D-A type π-conjugated polymer is likely to cause an increase in the charge of the polymer due to Pd clusters (particularly Pd clusters and oxygen) and an aggregate due to this. Thus, if the number of Pd clusters is controlled to a predetermined value or less, an effect of suppressing the viscosity according to the invention is likely to be exerted.

The polymer for organic photoelectric conversion material may contain a structural unit represented by formula (I) and/or a structural unit represented by formula (II). In this case, the total amount of the structural units represented by formula (I) and the structural unit represented by formula (II) is usually from 20 to 100 mol % when the amount of all the structural units contained in the π-conjugated polymer is 100 mol %. From the viewpoint of improving the charge transport property of the π-conjugated polymer, the amount is preferably from 40 to 100 mol % and more preferably from 50 to 100 mol %.

In one embodiment of the invention, the polymer for organic photoelectric conversion material preferably has a thiophene ring from the viewpoint of having excellent organic photoelectric conversion performance and easily and effectively suppressing an increase in solution viscosity after storage. For example, the polymer for organic photoelectric conversion material may contain a structural unit represented by formula (I) and/or a structural unit represented by formula (II). In this case, it is preferable that $Ar^1$ and/or $Ar^2$ in formula (I) is a structural unit containing a thiophene ring, and/or $Ar^3$ in formula (II) is a structural unit containing a thiophene ring.

In one embodiment of the invention, from the viewpoint of having excellent organic photoelectric conversion performance and easily and effectively suppressing an increase in solution viscosity after storage, the polymer for organic photoelectric conversion material preferably contains at least one structural unit selected from the group consisting of a structural unit represent by formula (501) (hereinafter, referred to as the formula (501) unit, etc.), the formula (502)

unit, the formula (503) unit, the formula (504) unit, the formula (505) unit, the formula (506) unit, the formula (II-1) unit, the formula (II-2) unit, the formula (II-3) unit, the formula (II-4) unit, the formula (II-5) unit, and the formula (II-6). It is more preferable to include at least one structural unit selected from the group consisting of the formula (501) unit, the formula (503) unit, the formula (II-1) unit, the formula (II-3) unit, the formula (II-4) unit, the formula (II-5) unit, and the formula (II-6).

Specific examples of the polymer for organic photoelectric conversion material include each polymer represented by the formulas below. The preferable ratio (mol %) of each structural part is described below, but the ratio is not limited thereto.

[Chem. 22]

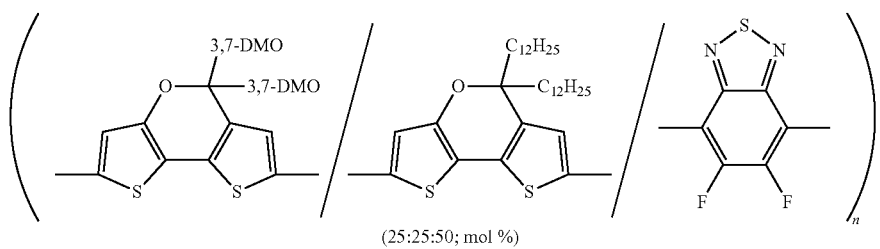

P-1

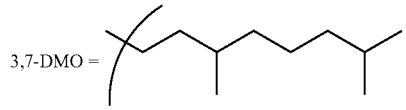

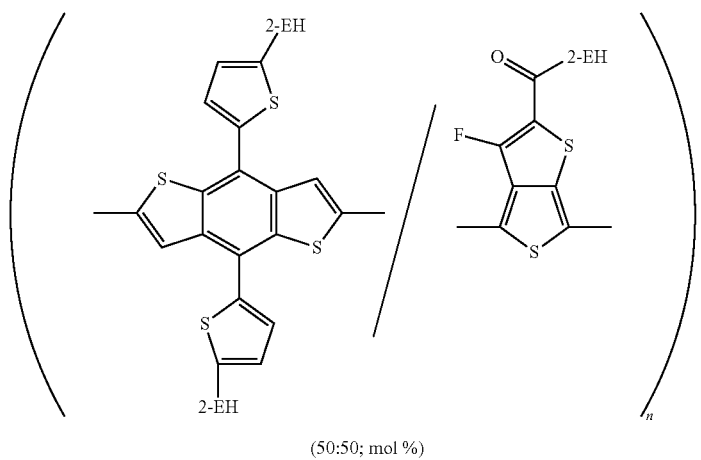

P-2

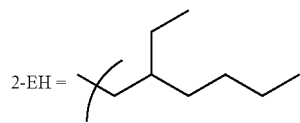

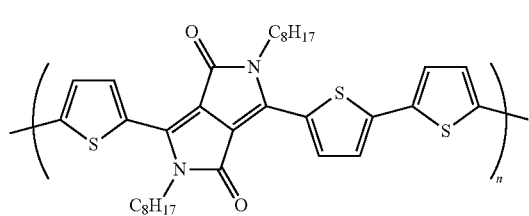

P-3

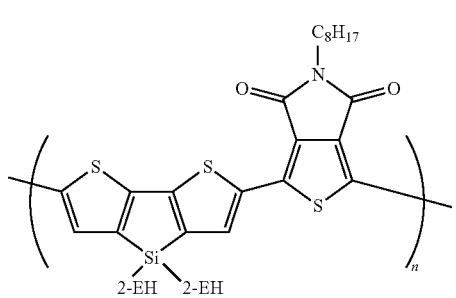

P-4

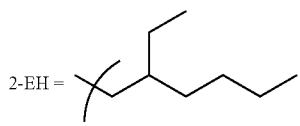

-continued

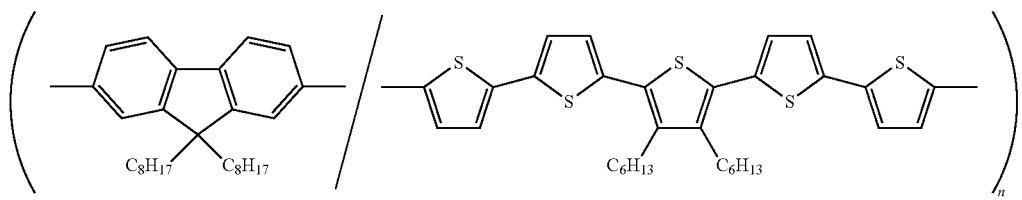

P-5

(50:50; mol %)

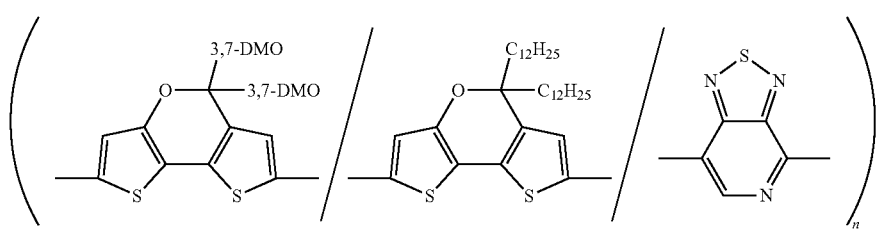

P-6

(25:25:50; mol %)

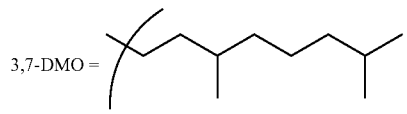

3,7-DMO =

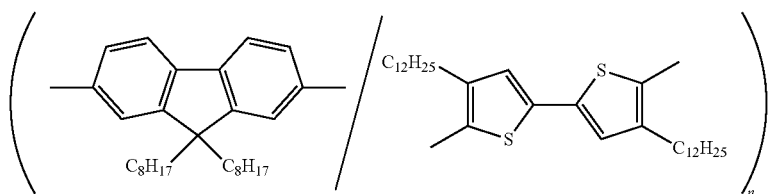

(50:50; mol %)

The weight average molecular weight of the polymer for organic photoelectric conversion material in terms of polystyrene is usually from 1,000 to 100,000,000, preferably from 5,000 to 1,000,000, more preferably from 10,000 to 500,000, and still more preferably from 30,000 to 300,000 from the viewpoint of solubility in a solvent. Note that the weight average molecular weight (Mw) can be measured by gel permeation chromatography (GPC).

The organic photoelectric conversion material containing Pd is susceptible to deterioration by, in particular, oxygen, and the long-term storage has been difficult. This seems to be because coordination of an oxygen atom(s) to the Pd cluster accelerates the deterioration of the organic photoelectric conversion material as described above. In the organic photoelectric conversion material of the invention, the number of Pd clusters is lowered to a predetermined value or less. As a result, deterioration promoted by oxygen can be effectively suppressed. This can effectively suppress an increase in solution viscosity even if the organic photoelectric conversion material is stored in, for example, a sealable container under ambient atmosphere.

In one embodiment of the invention, the organic photoelectric conversion material, preferably the polymer for organic photoelectric conversion material is produced using a Pd-containing catalyst. In such a case, Pd remains in the organic conversion material. The organic photoelectric conversion material of the invention is characterized in that the number of aggregates (clusters) formed by gathering Pd atoms is reduced. In one embodiment of the invention, the effect of the invention is exerted independently of the content of all Pd in the organic photoelectric conversion material, for example, the amount of Pd in the organic photoelectric conversion material as measured by atomic absorption spectroscopy. That is, in one embodiment of the invention, in the organic photoelectric conversion material, the number of Pd clusters may be lowered to a predetermined value or less even if the total amount of Pd in the material is relatively large. In this case, an increase in solution viscosity after storage can be suppressed.

In one embodiment of the invention, the degree of increase in viscosity of the organic photoelectric conversion material of the invention is preferably 1.03 or less and more preferably 1.01 or less. The degree of increase in viscosity is obtained by dividing the solution viscosity (mPa·s) of the organic photoelectric conversion material after storage by the solution viscosity (mPa·s) of the organic photoelectric conversion material before storage. The solution viscosity of the organic photoelectric conversion material can be measured and the material can be stored, for example, by the procedures described in Examples.

Hereinafter, a method of producing an organic photoelectric conversion material will be described by taking as an example a method of producing a polymer for organic photoelectric conversion material (sometimes simply referred to as a polymer).

[Method of Producing Polymer for Organic Photoelectric Conversion Material]

The invention provides a method of producing a polymer for organic photoelectric conversion material containing Pd, the method comprising the step of causing a chelator to contact a solution of the polymer at a temperature of 80° C. or higher (referred to as step (A)), wherein an average number of Pd clusters in a scanning transmission electron microscopic image of a thin film made of the polymer for organic photoelectric conversion material is 1500 counts/µm³ or less.

A polymer solution in which a crude polymer for organic photoelectric conversion material containing Pd (sometimes simply referred to as a crude polymer) has been dissolved is subjected to step (A). This makes it possible to produce a polymer for organic photoelectric conversion material such that the average number of Pd clusters in a STEM image is 1500 counts/µm³ or less. This may be because the Pd clusters incorporated in the crude polymer are released by causing the crude polymer, which can form aggregates in the solution, to contact the chelator at a high temperature of 80° C. or higher. Note that as used herein, the crude polymer for organic photoelectric conversion material (crude polymer) refers to a polymer for organic photoelectric conversion material before subjected to step (A). Further, the weight average molecular weight of the crude polymer is the same as that of the polymer for organic photoelectric conversion material.

The crude polymer may be produced, for example, in accordance with any of conventional methods (e.g., the methods described in WO 2013051676, WO 2011052709, WO 2018220785, etc.) or commercially available products may be used. An example of a method of producing a crude polymer is shown below.

<Method of Producing Crude Polymer>

In one embodiment of the invention, the crude polymer can be produced by a method including the step of reacting a compound represented by formula (2) and a compound represented by formula (3) in a reaction solvent containing a palladium catalyst and a base (reaction step).

(Compound Represented by Formula (2))

The compound represented by formula (2) is shown below.

[Chem. 23]

$$X^1-Ar^4-X^2 \quad (2)$$

In formula (2), $X^1$ and $X^2$ each independently represent a chlorine atom, a bromine atom, or an iodine atom.

$Ar^4$ is the same as the above formula (I) or (II).

To make the crude polymer easily synthesized, $X^1$ and $X^2$ are, each independently, preferably a bromine atom or an iodine atom and more preferably a bromine atom.

Since the compound represented by formula (2) can be easily synthesized, $X^1$ and $X^2$ are preferably identical to each other, and more preferably both are bromine atoms.

The compound represented by formula (2) includes any combination of any instance of $Ar^4$, which is the above formula (I) or (II), any instance of $X^1$, and any instance of $X^2$.

In the production method of the invention, the amount of the compound represented by formula (2) to be used is usually from 0.5 to 1.5 mol and preferably from 0.8 to 1.2 mol per mol of the compound represented by formula (3) described later.

The compound represented by formula (2) can be produced by a known procedure. For example, the compound represented by formula (2) can be produced by treating the compound of formula (2) where $X^1$ and $X^2$ are hydrogen atoms with a halogenating agent such as N-bromosuccinimide by a known procedure.

One or two or more kinds of the compound represented by formula (2) may be used.

(Compound Represented by Formula (3))

The compound represented by formula (3) is shown below.

[Chem. 24]

$$Y^1-Ar^B-Y^2 \quad (3)$$

In formula (3), $Y^1$ and $Y^2$ each independently represent a monovalent group containing one boron atom and at least two oxygen atoms.

$Ar^B$ is the same as the above formula (I) or (II).

Examples of the monovalent group that contains one boron atom and at least two oxygen atoms and is represented by $Y^1$ or $Y^2$ include a group represented by $-B(OH)_2$ or $-B(-O-R^B)_2$. Here, the two $R^B$ moieties each independently represent a monovalent hydrocarbon group optionally having a hydroxy group, and the two $R^B$ moieties may be together bonded to form a divalent group.

Specific examples of the monovalent group containing one boron atom and at least two oxygen atoms include each group represented by the following formulas (Ba-1) to (Ba-12). In formulas (Ba-1) to (Ba-12), M represents a Group 1 element. M is preferably a lithium atom, a sodium atom, or a potassium atom. Me represents a methyl group.

[Chem. 25]

(Ba-1)

(Ba-2)

(Ba-3)

(Ba-4)

(Ba-5)

(Ba-6)

(Ba-7)

(Ba-8)
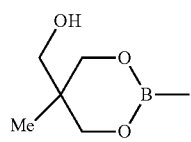

(Ba-9)
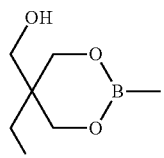

(Ba-10)
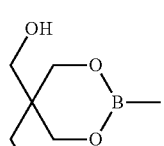

(Ba-11)
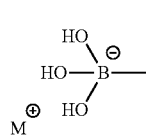

(Ba-12)
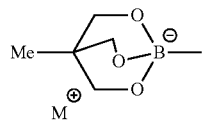

The compound represented by formula (3) includes any combination of any instance of Ar$^B$, which is the above formula (I) or (II), any instance of the above Y$^1$, and any instance of the above Y$^2$.

In formula (3), the groups represented by Y$^1$ and Y$^2$ may be the same or different from each other. Since the compounds represented by formula (3) can be easily synthesized, they are preferably the same.

The compound represented by formula (3) may be used singly or two or more kinds thereof may be used in combination. Further, Ar$^A$ in formula (2) and Ar$^B$ in formula (3) may be the same or different.

Specific examples of the compound represented by formula (3) include each compound represented by the following formulas (601) to (616). In formulas (601) to (616), R has the same meaning as described above.

[Chem. 26]

(601)
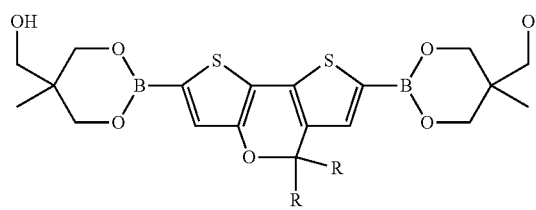

(602)
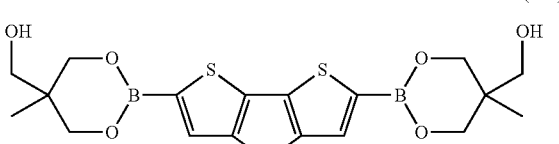

(603)
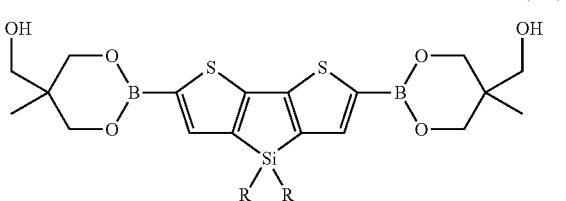

(604)
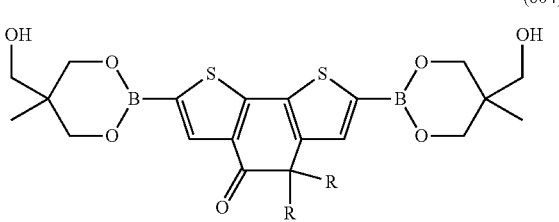

(605)
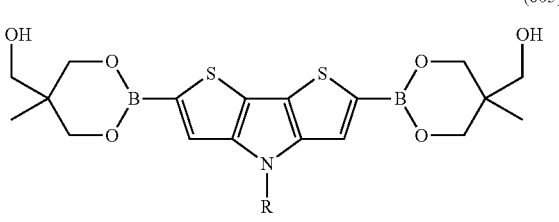

(606)
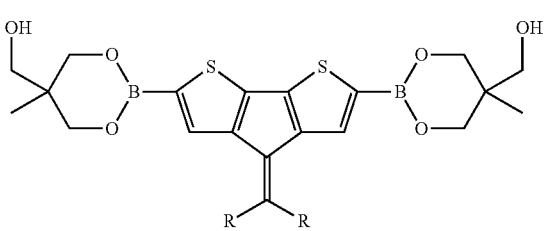

(607)
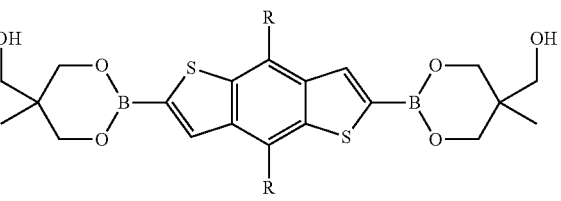

(608)
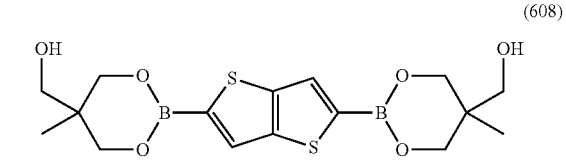

[Chem. 27]

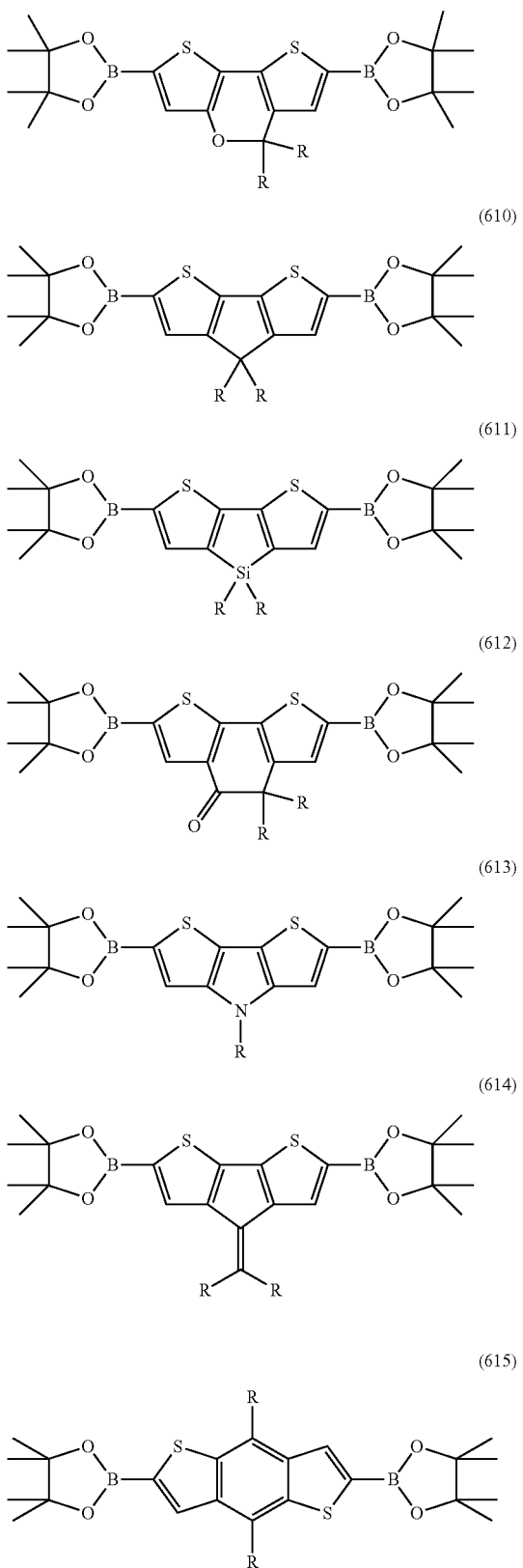

The compound represented by formula (3) can be produced by a known procedure.

For example, the compound represented by formula (3) in which $Y^1$ and $Y^2$ are groups represented by $-B(-O-R^B)_2$ may be produced by subjecting, for instance, a compound represented by a diboronic acid $(HO)_2B-Ar^B-B(OH)_2$ (where $Ar^B$ has the same meaning as above) and an alcohol represented by $R^B-OH$ or, in the case where two $R^B$ moieties are together bonded to form a divalent group in a group represented by $B(-O-R^B)_2$, a compound represented by an alcohol $HO-R^{2B}-OH$ (where $R^{2B}$ represents a divalent group formed by bonding two $R^B$ moieties to each other) to a dehydration reaction.

The compound represented by $(HO)_2B-Ar^B-B(OH)_2$ (where $Ar^B$ has the same meaning as above) can be produced by reacting, for example, a compound represented by Hal-$Ar^B$-Hal (where Hal each independently represents a hydrogen atom, a bromine atom, or an iodine atom) with a metallizing agent to prepare a compound represented by Mtl-$Ar^B$-Mtl (where Mtl represents a metal atom) and by reacting the resulting compound represented by Mtl-$Ar^B$-Mtl with a dihydroxyboronizing agent.

Examples of the metallizing agent include alkyllithium or lithium amide.

Examples of the dihydroxyboronizing agent include trialkyloxyborane.

(Reaction Solvent)

The reaction solvent used for production of the crude polymer contains: a first solvent, which is at least one hydrocarbon solvent; a second solvent, which is at least one organic solvent consisting of at least one carbon atom, at least one hydrogen atom, and at least one oxygen atom; and water.

The reaction solvent optionally contains an optional solvent in addition to the first solvent, the second solvent, and water. Examples of the optional solvent include dichloromethane, chloroform, carbon tetrachloride, dichloroethane, trichloroethane, tetrachloroethane, monochlorobenzene, dichlorobenzene, or trichlorobenzene. The volume ratio of the optional solvent based on the total volume of the first solvent, the second solvent, and water is preferably 50% by volume or less, more preferably 25% by volume or less, and still more preferably 10% by volume or less. The reaction solvent preferably essentially consists of the first solvent, the second solvent, and water.

Examples of the first solvent include an aliphatic hydrocarbon solvent, an alicyclic hydrocarbon solvent, or an aromatic hydrocarbon solvent.

Examples of the aliphatic hydrocarbon solvent include hexane, heptane, octane, nonane, decane, undecane, or dodecane.

Examples of the alicyclic hydrocarbon solvent include cyclohexane or decalin.

Examples of the aromatic hydrocarbon solvent include benzene, toluene, xylene, trimethylbenzene (e.g., mesitylene), tetralin, indane, naphthalene, or methylnaphthalene.

For the first solvent, one kind of hydrocarbon solvent may be used singly, or two or more kinds of hydrocarbon solvent may be used in combination.

Preferably, the first solvent is one or more solvents selected from the group consisting of toluene, xylene, trimethylbenzene, decalin, tetralin, indane, naphthalene, and methylnaphthalene. More preferred is one or more solvents selected from the group consisting of toluene, mesitylene, and tetralin. Still more preferred is toluene, mesitylene, or tetralin.

An organic solvent as the second solvent may have just one or two or more oxygen atom-containing groups such as a hydroxy group, an oxo group, an oxycarbonyl group (a group represented by —(C=O)—O—), or an ether bond (a group represented by —O—).

Further, the organic solvent as the second solvent may have just one or two or more oxygen atom-containing groups.

Examples of the second solvent include an alcohol solvent, an ether solvent, a ketone solvent, a phenolic solvent, or a carboxylic acid ester solvent.

Examples of the alcohol solvent include a primary alcohol (e.g., methanol, ethanol, 2-phenylethanol, n-propyl alcohol, n-butyl alcohol, 3-methyl-1-butanol, 1-pentanol, 1-hexanol, 2-ethyl-1-hexanol, 1-octanol, benzyl alcohol), a secondary alcohol (e.g., isopropyl alcohol, sec-butyl alcohol, 2-octanol, 3-pentanol, cyclohexanol), or a tertiary alcohol (e.g., tert-butyl alcohol, 1-methylcyclohexanol, 1-ethylcyclohexanol, 1-methylcyclopentanol, tert-amyl alcohol, 2-phenyl-2-propanol, 2-methyl-1-phenyl-2-propanol, 2-methyl-2-pentanol, 3-ethyl-3-pentanol).

Examples of the ether solvent include anisole, cyclopentyl methyl ether, tert-butyl methyl ether, diethyl ether, diisopropyl ether, ethylene glycol dimethyl ether, diethylene glycol dimethyl ether, tetrahydrofuran, 2-methyltetrahydrofuran, or 1,4-dioxane.

Examples of the ketone solvent include acetone, methyl ethyl ketone, methyl isobutyl ketone, or cyclohexanone.

Examples of the phenolic solvent include phenol, o-cresol, m-cresol, or p-cresol.

Examples of the carboxylic acid ester solvent include ethyl acetate, propyl acetate, butyl acetate, methyl propionate, ethyl propionate, propyl propionate, butyl propionate, methyl benzoate, ethyl benzoate, propyl benzoate, butyl benzoate, or γ-butyl lactone.

For the second solvent, one kind may be used singly or two or more kinds may be used in combination.

The second solvent is preferably one or more solvents selected from the group consisting of an alcohol solvent, an ether solvent, and a ketone solvent. More preferred is a tertiary alcohol solvent. Still more preferred is one or more solvents selected from the group consisting of 1-methylcyclopentanol, 1-methylcyclohexanol, 1-ethylcyclohexanol, and 2-phenyl-2-propanol.

The second solvent may be a solvent immiscible with water. That a certain solvent is "immiscible with water" means that a transparent single phase solution is not formed by using a liquid obtained by adding 5 mass % or more of water to 100 mass % of the solvent or a liquid obtained by adding 5 mass % or more of the solvent to 100 mass % of water.

Examples of a water-immiscible solvent that can be used as the second solvent include 2-phenylethanol, 3-methyl-1-butanol, 1-pentanol, 1-hexanol, 2-ethyl-1-hexanol, 1-octanol, benzyl alcohol, 2-octanol, cyclohexanol, 1-methylcyclohexanol, 1-ethylcyclohexanol, 1-methylcyclopentanol, 2-phenyl-2-propanol, 2-methyl-1-phenyl-2-propanol, 2-methyl-2-pentanol, 3-ethyl-3-pentanol, anisole, cyclopentylmethyl ether, tert-butyl methyl ether, diisopropyl ether, methylisobutylketone, o-cresol, m-cresol, p-cresol, propyl acetate, butyl acetate, methyl propionate, ethyl propionate, propyl propionate, butyl propionate, methyl benzoate, ethyl benzoate, propyl benzoate, or butyl benzoate. Preferred is one or more solvents selected from the group consisting of 2-phenylethanol, 1-pentanol, 1-methylcyclohexanol, 1-ethylcyclohexanol, 1-methylcyclopentanol, 2-phenyl-2-propanol, 2-methyl-1-phenyl-2-propanol, 3-ethyl-3-pentanol, and anisole.

That a certain solvent is "miscible with water" means that a transparent single phase solution is formed by using any of both a liquid obtained by adding 5 mass % or more of water to 100 mass % of the solvent and a liquid obtained by adding 5 mass % or more of the solvent to 100 mass % of water.

The second solvent may be a solvent miscible with water. Examples of a water-miscible solvent that can be used as the second solvent include methanol, ethanol, n-propyl alcohol, n-butyl alcohol, isopropyl alcohol, sec-butyl alcohol, 3-pentanol, tert-butyl alcohol, tert-amyl alcohol, diethyl ether, ethylene glycol dimethyl ether, diethylene glycol dimethyl ether, tetrahydrofuran, 2-methyl tetrahydrofuran, 1,4-dioxane, acetone, methyl ethyl ketone, cyclohexanone, phenol, ethyl acetate, or γ-butyl lactone. Preferred is one or more solvents selected from the group consisting of n-propyl alcohol, n-butyl alcohol, tert-butyl alcohol, tert-amyl alcohol, ethylene glycol dimethyl ether, tetrahydrofuran, 2-methyl tetrahydrofuran, 1,4-dioxane, methyl ethyl ketone, and cyclohexanone. More preferred is one or more solvents selected from the group consisting of tert-butyl alcohol, tert-amyl alcohol, ethylene glycol dimethyl ether, tetrahydrofuran, and 2-methyl tetrahydrofuran.

Examples of a combination of the first solvent and the second solvent include any one of combinations of any example mentioned as the first solvent and any example mentioned as the second solvent. The combination of the first solvent and the second solvent is not particularly limited, and examples thereof include any one of the combinations shown in Table 1 below. When the second solvent is a solvent immiscible with water, the combinations listed in Table 2 below are preferable, and the combinations listed in Table 3 below are more preferable. When the second solvent is miscible with water, the combinations listed in Table 4 below are preferable.

TABLE 1

| First solvent | Second solvent |
| --- | --- |
| Toluene | 2-Phenylethanol |
| Toluene | 1-Pentanol |
| Toluene | 1-Methylcyclohexanol |
| Toluene | 1-Ethylcyclohexanol |
| Toluene | 1-Methylcyclopentanol |
| Toluene | 2-Phenyl-2-propanol |
| Toluene | 2-Methyl-1-phenyl-2-propanol |
| Toluene | 3-Ethyl-3-pentanol |
| Toluene | Anisole |
| Toluene | tert-Butyl alcohol |
| Toluene | tert-Amyl alcohol |
| Toluene | Ethylene glycol dimethyl ether |
| Toluene | Tetrahydrofuran |
| Toluene | 2-Methyl tetrahydrofuran |
| Mesitylene | 2-Phenylethanol |
| Mesitylene | 1-Pentanol |
| Mesitylene | 1-Methylcyclohexanol |
| Mesitylene | 1-Ethylcyclohexanol |
| Mesitylene | 1-Methylcyclopentanol |
| Mesitylene | 2-Phenyl-2-propanol |
| Mesitylene | 2-Methyl-1-phenyl-2-propanol |
| Mesitylene | 3-Ethyl-3-pentanol |
| Mesitylene | Anisole |
| Mesitylene | tert-Butyl alcohol |

TABLE 1-continued

| First solvent | Second solvent |
|---|---|
| Mesitylene | tert-Amyl alcohol |
| Mesitylene | Ethylene glycol dimethyl ether |
| Mesitylene | Tetrahydrofuran |
| Mesitylene | 2-Methyl tetrahydrofuran |
| Tetralin | 2-Phenylethanol |
| Tetralin | 1-Pentanol |
| Tetralin | 1-Methylcyclohexanol |
| Tetralin | 1-Ethylcyclohexanol |
| Tetralin | 1-Methylcyclopentanol |
| Tetralin | 2-Phenyl-2-propanol |
| Tetralin | 2-Methyl-1-phenyl-2-propanol |
| Tetralin | 3-Ethyl-3-pentanol |
| Tetralin | Anisole |
| Tetralin | tert-Butyl alcohol |
| Tetralin | tert-Amyl alcohol |
| Tetralin | Ethylene glycol dimethyl ether |
| Tetralin | Tetrahydrofuran |
| Tetralin | 2-Methyl tetrahydrofuran |

TABLE 2

| First solvent | Second solvent |
|---|---|
| Toluene | 1-Methylcyclohexanol |
| Toluene | 1-Ethylcyclohexanol |
| Toluene | 1-Methylcyclopentanol |
| Toluene | 2-Phenyl-2-propanol |
| Toluene | Anisole |
| Mesitylene | 1-Methylcyclohexanol |
| Mesitylene | 1-Ethylcyclohexanol |
| Mesitylene | 1-Methylcyclopentanol |
| Mesitylene | 2-Phenyl-2-propanol |
| Mesitylene | Anisole |
| Tetralin | 1-Methylcyclohexanol |
| Tetralin | 1-Ethylcyclohexanol |
| Tetralin | 1-Methylcyclopentanol |
| Tetralin | 2-Phenyl-2-propanol |
| Tetralin | Anisole |

TABLE 3

| First solvent | Second solvent |
|---|---|
| Toluene | 1-Methylcyclohexanol |
| Toluene | 1-Ethylcyclohexanol |
| Toluene | 1-Methylcyclopentanol |
| Toluene | 2-Phenyl-2-propanol |
| Mesitylene | 1-Methylcyclohexanol |
| Mesitylene | 1-Ethylcyclohexanol |
| Mesitylene | 1-Methylcyclopentanol |
| Mesitylene | 2-Phenyl-2-propanol |
| Tetralin | 1-Methylcyclohexanol |
| Tetralin | 1-Ethylcyclohexanol |
| Tetralin | 1-Methylcyclopentanol |
| Tetralin | 2-Phenyl-2-propanol |

TABLE 4

| First solvent | Second solvent |
|---|---|
| Toluene | tert-Butyl alcohol |
| Toluene | tert-Amyl alcohol |
| Toluene | Ethylene glycol dimethyl ether |
| Toluene | Tetrahydrofuran |
| Toluene | 2-Methyl tetrahydrofuran |
| Mesitylene | tert-Butyl alcohol |
| Mesitylene | tert-Amyl alcohol |
| Mesitylene | Ethylene glycol dimethyl ether |
| Mesitylene | Tetrahydrofuran |
| Mesitylene | 2-Methyl tetrahydrofuran |
| Tetralin | tert-Butyl alcohol |

TABLE 4-continued

| First solvent | Second solvent |
|---|---|
| Tetralin | tert-Amyl alcohol |
| Tetralin | Ethylene glycol dimethyl ether |
| Tetralin | Tetrahydrofuran |
| Tetralin | 2-Methyl tetrahydrofuran |

The first solvent, the second solvent, and water are mixed in a volume ratio of a:b:c. Here, a+b+c=100, and c is more than 10 and less than 100. That is, the volume ratio c (%) of water to the total volume of the first solvent, the second solvent, and water is more than 10% by volume and less than 100% by volume.

The volume ratio of water is determined based on the volume of the first solvent, the volume of the second solvent, and the volume of water as used to prepare the reaction solvent.

When the second solvent is miscible with water, the volume ratio c (%) of water to the total volume of the first solvent, the second solvent, and water is more than 10% by volume, preferably. 25% by volume or more, more preferably more than 25% by volume, still more preferably 35% by volume or more, still more preferably more than 35% by volume, still more preferably 45% by volume or more, still more preferably more than 45% by volume, still more preferably 50% by volume or more, and particularly preferably more than 50% by volume.

When the second solvent is miscible with water, the volume ratio c (%) of water to the total volume of the first solvent, the second solvent, and water is preferably less than 100% by volume, preferably 90% by volume or less, more preferably less than 90% by volume, still more preferably 80% by volume or less, still more preferably less than 80% by volume, still more preferably 70% by volume or less, still more preferably less than 70% by volume, still more preferably 65% by volume or less, and particularly preferably less than 65% by volume.

When the second solvent is miscible with water, the volume ratio c (%) of water to the total volume of the first solvent, the second solvent, and water is more than 10% by volume and less than 100% by volume, preferably 25% by volume or more and 90% by volume or less, more preferably more than 25% by volume and less than 90% by volume, still more preferably 35% by volume or more and 80% by volume or less, still more preferably more than 35% by volume and less than 80% by volume, still more preferably 45% by volume or more and 70% by volume or less, still more preferably more than 45% by volume and less than 70% by volume, still more preferably 50% by volume or more and 65% by volume or less, and particularly preferably more than 50% by volume and less than 65% by volume.

If the second solvent is immiscible with water, the volume ratio c (%) of water to the total volume of the first solvent, the second solvent, and water is more than 10% by volume, preferably 20% by volume or more, more preferably more than 20% by volume, still more preferably 25% by volume or more, still more preferably more than 25% by volume, still more preferably 35% by volume or more, still more preferably more than 35% by volume, still more preferably 45% by volume or more, still more preferably more than 45% by volume, still more preferably 50% by volume or more, and particularly preferably more than 50% by volume.

When the second solvent is immiscible with water, the volume ratio c (%) of water to the total volume of the first solvent, the second solvent, and water is less than 100% by volume, preferably 90% by volume or less, more preferably less than 90% by volume, still more preferably 80% by volume or less, still more preferably less than 80% by volume, still more preferably 70% by volume or less, still more preferably less than 70% by volume, still more preferably 65% by volume or less, and particularly preferably less than 65% by volume.

If the second solvent is immiscible with water, the volume ratio c (%) of water to the total volume of the first solvent, the second solvent, and water is more than 10% by volume and less than 100% by volume, preferably 20% by volume or more and 90% by volume or less, more preferably more than 20% by volume and less than 90% by volume, still more preferably 25% by volume or more and 90% by volume or less, still more preferably more than 25% by volume and less than 90% by volume, still more preferably 35% by volume or more and 80% by volume or less, still more preferably more than 35% by volume and less than 80% by volume, still more preferably 45% by volume or more and 70% by volume or less, still more preferably more than 45% by volume and less than 70% by volume, still more preferably 50% by volume or more and 65% by volume or less, and particularly preferably more than 50% by volume and less than 65% by volume.

The mixed volume ratio a:b between the first solvent and the second solvent is preferably in the range of 1:9 to 9:1, and more preferably in the range of 3:7 to 7:3.

By setting the volume ratio of water in the above range, a crude polymer having a large weight average molecular weight can be produced. By using such a crude polymer, the electrical characteristics of this electronic device can be further improved.

(Palladium Catalyst)

Examples of a palladium catalyst used to produce the crude polymer include a Pd(0) catalyst and a Pd(II) catalyst. Specific examples of the palladium catalyst include palladium[tetrakis(triphenylphosphine)], dichlorobis(triphenylphosphine)palladium, palladium(II) acetate, tris(dibenzylideneacetone)dipalladium, bis(dibenzylideneacetone)palladium, bis(tri-tert-butylphosphine)palladium(0), a palladium complex represented by formula (C) below, or a palladium complex represented by formula (C') below. In the production method of the invention, one type of palladium catalyst may be used singly, or two or more types may be used in combination.

[Chem. 28]

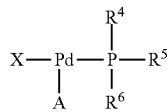

(C)

In formula (C),

X represents a chlorine atom, a bromine atom or an iodine atom.

A represents a $C_{1-3}$ alkyl group.

$R^4$ represents a $C_{4-20}$ heteroaryl group optionally substituted with a $C_{1-20}$ alkyl group or a $C_{5-10}$ cycloalkyl group; and $R^5$ and $R^6$ each independently represent a $C_{1-20}$ alkyl group or a $C_{5-10}$ cycloalkyl group. The number of carbon atoms of the aryl group or the heteroaryl group excludes the number of carbon atoms of its substituent(s). The substituent optionally included in the aryl group or the heteroaryl group is selected from group 1 below.

[Chem. 29]

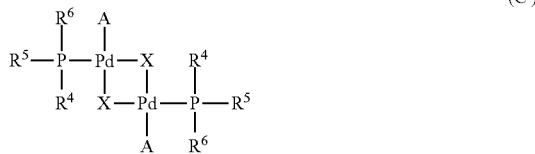

(C')

In formula (C'), X, A, $R^4$, $R^5$ and $R^6$ have the same meanings as above. The plurality of X, A, $R^4$, $R^5$ or $R^6$ moieties may be the same or different.

Group 1: a fluorine atom, an alkyl group, a cycloalkyl group, an alkyloxy group, a cycloalkyloxy group, an alkylthio group, a cycloalkylthio group, an aryl group, an aryloxy group, an arylthio group, an arylalkyl group, an arylcycloalkyl group, an arylalkenyl group, an arylalkynyl group, a monovalent heterocyclic group optionally having an alkyl group, a group represented by —N(R')$_2$ (two R' moieties each independently represent a hydrogen atom, a $C_{1-20}$ monovalent hydrocarbon group, or a monovalent heterocyclic group optionally having an alkyl group), a group represented by —Si(R')$_3$ (R' has the same meaning as above, and the three R' moieties may be the same or different), an acyl group, a group having a carbon atom-nitrogen atom double bond, an acidimido group, an alkyloxycarbonyl group, a cycloalkyloxycarbonyl group, an aryloxycarbonyl group, a carboxy group, a cyano group, or a nitro group.

Specific examples of the palladium complex represented by formula (C) or formula (C') include (tri(tert-butyl)phosphine)chloromethylpalladium, (di-(tert-butyl) (4-fluorophenyl)phosphine)chloromethylpalladium, (di-(tert-butyl) (3-fluorophenyl)phosphine)chloromethylpalladium, (di-(tert-butyl) (4-methylphenyl)phosphine)chloromethylpalladium, (di-(tert-butyl) (3-methylphenyl)phosphine)chloromethylpalladium, (di-(tert-butyl) (4-ethylphenyl)phosphine)chloromethylpalladium, (di-(tert-butyl) (3-ethylphenyl)phosphine)chloromethylpalladium, (di-(tert-butyl) (4-isopropylphenyl)phosphine)chloromethylpalladium, (di-(tert-butyl) (3-isopropylphenyl)phosphine)chloromethylpalladium, (di-(tert-butyl) (4-tert-buthylphenyl)phosphine)chloromethylpalladium, (di-(tert-butyl) (3-tert-buthylphenyl)phosphine)chloromethylpalladium, (di-(tert-butyl) (4-methoxyphenyl)phosphine)chloromethylpalladium, (di-(tert-butyl) (3-methoxyphenyl)phosphine)chloromethylpalladium, (di-(tert-butyl) (4-ethoxyphenyl)phosphine)chloromethylpalladium, (di-(tert-butyl) (3-ethoxyphenyl)phosphine)chloromethylpalladium, (di-(tert-butyl) (4-trifluoromethoxyphenyl)phosphine)chloromethylpalladium, (di-(tert-butyl) (3-trifluoromethoxyphenyl)phosphine)chloromethylpalladium, (di-(tert-butyl) (4-pentafluoromethoxyphenyl)phosphine)chloromethylpalladium, (di-(tert-butyl) (3-pentafluoromethoxyphenyl)phosphine)chloromethylpalladium, (di-(tert-butyl) ([1,1'-biphenyl]-4-yl)phosphine)chloromethylpalladium, (di-(tert-butyl) ([1,1'-biphenyl]-3-yl)phosphine)chloromethylpalladium, (di-(tert-butyl) (2-naphthyl)phosphine)chloromethylpalladium, (di-(tert-butyl) (3,5-difluorophenyl)phosphine)chloromethylpalladium, (di-(tert-butyl) (3,5-dimethylphenyl)phosphine)chloromethylpalladium, (di-(tert-butyl) (3,5-diethylphenyl)phosphine)chloromethylpalladium, (di-(tert-butyl) (3,5-diisopropylphenyl)phosphine)chloromethylpalladium, (di-(tert-butyl) (3,5-di-(tert-buthyl)phenyl)phosphine)chloromethylpalladium, (di-(tert-butyl) (3,5- dimethoxyphenyl)phosphine)chloromethylpalladium, (di-(tert-butyl) (3,5-diethoxyphenyl)phosphine)chloromethylpalladium, (di-(tert-butyl) (3,5-di-(trifluoromethoxy)phenyl)phosphine)chloromethylpalladium, (di-(tert-butyl) (3,5-di-(trifluoroethoxy)phenyl)phosphine)chloromethylpalladium, (di-(tert-butyl) (1,1':3',1"-terphenyl)-5'-yl)phosphine)chloromethylpalladium, (di-(tert-butyl) (2-methoxyphenyl)phosphine)chloromethylpalladium, (di-(tert-butyl) (3-methoxyphenyl)phosphine)chloromethylpalladium, (di-(tert-butyl) (4-methoxyphenyl)phosphine)chloromethylpalladium, (di-(tert-butyl) (2,3-dimethoxyphenyl)phosphine)chloromethylpalladium, (di-(tert-butyl) (2,4-dimethoxyphenyl)phosphine)chloromethylpalladium, (di-(tert-butyl) (2,5-dimethoxyphenyl)phosphine)chloromethylpalladium, (di-(tert-butyl) (2,6-dimethoxyphenyl)phosphine)chloromethylpalladium, (tricyclopentylphosphine)chloromethylpalladium, dicyclopentyl(4-fluorophenyl)phosphine)chloromethylpalladium, dicyclopentyl(3-fluorophenyl)phosphine)chloromethylpalladium, dicyclopentyl(4-methylphenyl)phosphine)chloromethylpalladium, dicyclopentyl(3-methylphenyl)phosphine)chloromethylpalladium, dicyclopentyl(4-ethylphenyl)phosphine)chloromethylpalladium, dicyclopentyl(3-ethylphenyl)phosphine)chloromethylpalladium, dicyclopentyl(4-isopropylphenyl)phosphine)chloromethylpalladium, dicyclopentyl(3-isopropylphenyl)phosphine)chloromethylpalladium, dicyclopentyl(4-tert-butylphenyl)phosphine)chloromethylpalladium, dicyclopentyl(3-tert-butylphenyl)phosphine)chloromethylpalladium, dicyclopentyl(4-methoxyphenyl)phosphine)chloromethylpalladium, dicyclopentyl(3-methoxyphenyl)phosphine)chloromethylpalladium, dicyclopentyl(4-ethoxyphenyl)phosphine)chloromethylpalladium, dicyclopentyl(3-ethoxyphenyl)phosphine)chloromethylpalladium, dicyclopentyl(4-trifluoromethoxyphenyl)phosphine)chloromethylpalladium, dicyclopentyl(3-trifluoromethoxyphenyl)phosphine)chloromethylpalladium, dicyclopentyl(4-pentafluoroethoxyphenyl)phosphine)chloromethylpalladium, dicyclopentyl(3-pentafluoroethoxyphenyl)phosphine)chloromethylpalladium, dicyclopentyl([1,1'-biphenyl]-4-yl)phosphine)chloromethylpalladium, dicyclopentyl([1,1'-biphenyl]-3-yl)phosphine)chloromethylpalladium, (dicyclopentyl(2-naphthyl)phosphine)chloromethylpalladium, dicyclopentyl(3,5-difluorophenyl)phosphine)chloromethylpalladium, dicyclopentyl(3,5-dimethylphenyl)phosphine)chloromethylpalladium, dicyclopentyl(3,5-diethylphenyl)phosphine)chloromethylpalladium, dicyclopentyl(3,5-diisopropylphenyl)phosphine)chloromethylpalladium, dicyclopentyl(3,5-di-(tert-butyl)phenyl)phosphine)chloromethylpalladium, dicyclopentyl(3,5-dimethoxyphenyl)phosphine)chloromethylpalladium, dicyclopentyl(3,5-diethoxyphenyl)phosphine)chloromethylpalladium, dicyclopentyl(3,5-di-(trifluoromethoxy)phenyl)phosphine)chloromethylpalladium, dicyclopentyl(3,5-di-(trifluoroethoxy)phenyl)phosphine)chloromethylpalladium, dicyclopentyl(1,1':3',1"-terphenyl)-5'-yl)phosphine)chloromethylpalladium, dicyclopentyl(2-methoxyphenyl)phosphine)chloromethylpalladium, dicyclopentyl(3-methoxyphenyl)phosphine)chloromethylpalladium, dicyclopentyl(4-methoxyphenyl)phosphine)chloromethylpalladium, dicyclopentyl(2,3-dimethoxyphenyl)phosphine)chloromethylpalladium, dicyclopentyl(2,4-dimethoxyphenyl)phosphine)chloromethylpalladium, dicyclopentyl(2,5-dimethoxyphenyl)phosphine)chloromethylpalladium, dicyclopentyl(2,6-dimethoxyphenyl)phosphine)chloromethylpalladium, (tricyclohexylphosphine)chloromethylpalladium, (dicyclohexyl(4-fluorophenyl)phosphine)chloromethylpalladium, (dicyclohexyl(3-fluorophenyl)phosphine)chloromethylpalladium, (dicyclohexyl(4-methylphenyl)phosphine)chloromethylpalladium, (dicyclohexyl(3-methylphenyl)phosphine)chloromethylpalladium, (dicyclohexyl(4-ethylphenyl)phosphine)chloromethylpalladium, (dicyclohexyl(3-ethylphenyl)phosphine)chloromethylpalladium, (dicyclohexyl(4-isopropylphenyl)phosphine)chloromethylpalladium, (dicyclohexyl(3-isopropylphenyl)phosphine)chloromethylpalladium, (dicyclohexyl(4-tert-butylphenyl)phosphine)chloromethylpalladium, (dicyclohexyl(3-tert-butylphenyl)phosphine)chloromethylpalladium, (dicyclohexyl(4-methoxyphenyl)phosphine)chloromethylpalladium, (dicyclohexyl(3-methoxyphenyl)phosphine)chloromethylpalladium, (dicyclohexyl(4-ethoxyphenyl)phosphine)chloromethylpalladium, (dicyclohexyl(3-ethoxyphenyl)phosphine)chloromethylpalladium, (dicyclohexyl(4-trifluoromethoxyphenyl)phosphine)chloromethylpalladium, (dicyclohexyl(3-trifluoromethoxyphenyl)phosphine)chloromethylpalladium, (dicyclohexyl(4-pentafluoroethoxyphenyl)phosphine)chloromethylpalladium, (dicyclohexyl(3-pentafluoroethoxyphenyl)phosphine)chloromethylpalladium, (dicyclohexyl([1,1'-biphenyl]-4-yl)phosphine)chloromethylpalladium, (dicyclohexyl([1,1'-biphenyl]-3-yl)phosphine)chloromethylpalladium, (dicyclohexyl(2-naphthyl)phosphine)chloromethylpalladium, (dicyclohexyl(3,5-difluorophenyl)phosphine)chloromethylpalladium, (dicyclohexyl(3,5-dimethylphenyl)phosphine)chloromethylpalladium, (dicyclohexyl(3,5-diethylphenyl)phosphine)chloromethylpalladium, (dicyclohexyl(3,5-diisopropylphenyl)phosphine)chloromethylpalladium, (dicyclohexyl(3,5-di-(tert-butyl)phenyl)phosphine)chloromethylpalladium, (di-dicyclohexyl(3,5-dimethoxyphenyl)phosphine)chloromethylpalladium, (dicyclohexyl) (3,5-diethoxyphenyl)phosphine)chloromethylpalladium, (dicyclohexyl) (3,5-di-(trifluoromethoxy)phenyl)phosphine)chloromethylpalladium, (dicyclohexyl(3,5-di-(trifluoroethoxy)phenyl)phosphine) chloromethylpalladium, (dicyclohexyl(1,1':3',1"-terphenyl)-5'-yl)phosphine)chloromethylpalladium, (dicyclohexyl(2-methoxyphenyl)phosphine)chloromethylpalladium, (dicyclohexyl(3-methoxyphenyl)phosphine)chloromethylpalladium, (dicyclohexyl(4-methoxyphenyl)phosphine)chloromethylpalladium, (dicyclohexyl(2,3-dimethoxyphenyl)phosphine)chloromethylpalladium, (dicyclohexyl(2,4-dimethoxyphenyl)phosphine)chloromethylpalladium, (dicyclohexyl(2,5-dimethoxyphenyl)phosphine)chloromethylpalladium, or (dicyclohexyl(2,6-dimethoxyphenyl)phosphine)chloromethylpalladium.

The palladium complex represented by formula (C) can be synthesized according to the known procedure disclosed in, for instance, Organometallics, 2006, 25, 4588-4595.

The amount of the palladium catalyst added is not particularly limited, and is usually from 0.00001 to 0.8 mol, preferably from 0.00005 to 0.5 mol, and more preferably from 0.0001 to 0.2 mol based on 1 mol of the compound represented by formula (3).

In addition to the palladium catalyst, a compound serving as a ligand for the palladium catalyst may be added to the reaction solvent used to produce the crude polymer. The compound serving as a ligand for the palladium catalyst is not particularly limited, and examples thereof include trialkylphosphine, dialkylarylphosphine, alkyldiarylphosphine, or triarylphosphine. Further examples include triphenylphosphine, tri(o-tolyl)phosphine, tri(o-methoxyphenyl)phosphine, or tri-tert-butylphosphine.

The phosphorus compound serving as a ligand for the palladium catalyst may be obtained by reacting a phosphonium salt with a base. Examples of the phosphonium salt include a phosphorus compound (e.g., tri-tert-butylphosphonium tetrafluoroborate).

(Base)

The base used to produce the crude polymer may be an inorganic base or an organic base.

Preferable examples of the inorganic base include an alkali metal hydroxide, alkaline earth metal hydroxide, alkali metal carboxylate, alkaline earth metal carboxylate, alkali metal carbonate, alkaline earth metal carbonate, alkali metal hydrogen carbonate, alkaline earth metal hydrogen carbonate, alkali metal sulfate, alkaline earth metal sulfate, alkali metal phosphate, or alkaline earth metal phosphate. Preferred is one or more inorganic bases selected from the group consisting of alkali metal carbonates, alkali metal phosphates, alkaline earth metal carbonates, alkali metal sulfates, alkaline earth metal sulfates, and alkaline earth metal phosphates.

Note that as used herein, examples of the inorganic base include an alkali metal sulfate or an alkaline earth metal sulfate.

Specific examples of the inorganic base include lithium hydroxide, sodium hydroxide, potassium hydroxide, cesium hydroxide, calcium hydroxide, barium hydroxide, sodium formate, potassium formate, calcium formate, sodium acetate, potassium acetate, sodium carbonate, potassium carbonate, cesium carbonate, calcium carbonate, sodium hydrogen carbonate, potassium hydrogen carbonate, sodium phosphate, potassium phosphate, sodium hydrogen phosphate, potassium hydrogen phosphate, sodium dihydrogen phosphate, or potassium dihydrogen phosphate. As the inorganic base, sodium carbonate, potassium carbonate, cesium carbonate, sodium phosphate or potassium phosphate is preferable.

Examples of the organic base include alkali metal alkoxide (e.g., potassium tert-butoxide); alkaline earth metal alkoxide (e.g., sodium tert-butoxide); alkylammonium hydroxide; alkylammonium carbonate; alkylammonium bicarbonate; alkylammonium boronate; 1,5-diazabicyclo[4.3.0]nona-5-en (DBN); 1,8-diazabicyclo[5.4.0]undece-7-en (DBU); 1,4-diazabicyclo[2.2.2]octane (DABCO); dimethylaminopyridine (DMAP); pyridine; trialkylamine; or alkylammonium fluoride (e.g., tetraalkylammonium fluoride). As the organic base, potassium tert-butoxide, sodium tert-butoxide, or tetraalkylammonium hydroxide (e.g., tetramethylammonium hydroxide, tetraethylammonium hydroxide, tetra-n-propylammonium hydroxide) is preferable.

The amount of the base used is usually from 0.5 to 20 equivalents and preferably from 2 to 10 equivalents.

Here, the equivalent(s) refers to the ratio of the theoretical substance amount of hydrogen ion that can be neutralized by the base to the total substance amount of $X^1$ and $X^2$ contained in the compound represented by formula (2).

The base may be used as it is or in the form of an aqueous solution. When the base is used in the form of an aqueous solution, the volume of water used to prepare the aqueous solution of the base is included in the volume of water used to prepare the reaction solvent.

In the production method of the invention, two or more kinds of bases may be used in combination.

When an inorganic base is used as the base, a phase transfer catalyst may be used in combination. Examples of the phase transfer catalyst include an ammonium tetraalkyl halide, an ammonium tetraalkyl hydrogen sulfate, or an ammonium tetraalkyl hydroxide. As the inorganic base, an ammonium tetraalkyl halide (e.g., tricaprylmethylammonium chloride (available from Sigma-Aldrich as Aliquat® 336)) is preferable.

Examples of a combination of the first solvent, the second solvent, the catalyst, and the base include any one of combinations of any example mentioned as the first solvent, any example mentioned as the second solvent, any example mentioned as the catalyst, and any example mentioned as the base. The combination of the first solvent, the second solvent, the catalyst, and the base is not particularly limited, and examples thereof include each combination designated in Tables 5 and 6 below.

Among the combinations listed in Tables 5 and 6, a preferred combination is any of 3, 9, 13, 31, 38, or 41, and a more preferable combination is any of 3, 31, or 38.

TABLE 5

| Combination | First solvent | Second solvent | Catalyst | base |
|---|---|---|---|---|
| 1 | Toluene | 2-Phenylethanol | (tri-(tert-butyl)phosphine)chloromethylpalladium | Sodium carbonate |
| 2 | Toluene | 1-Pentanol | di-(tert-butyl)(4-methylphenyl(phosphine)chloromethylpalladium | Cesium carbonate |
| 3 | Toluene | 1-Methylcyclohexanol | bis(tri-tert-butylphosphine)palladium | Potassium phosphate |
| 4 | Toluene | 1-Ethylcyclohexanol | di-(tert-butyl)(3-trifluoromethoxyphenyl(phosphine)chloromethylpalladium | Sodium phosphate |
| 5 | Toluene | 1-Methylcyclopentanol | (tri-(tert-butyl)phosphine)chloromethylpalladium | Sodium carbonate |
| 6 | Toluene | 2-Phenyl-2-propanol | di-(tert-butyl)(4-methylphenyl(phosphine)chloromethylpalladium | Cesium carbonate |
| 7 | Toluene | 2-Methyl-1-phenyl-2-propanol | di-(tert-butyl)(4-tert-buthylphenyl(phosphine)chloromethylpalladium | Potassium phosphate |
| 8 | Toluene | 3-Ethyl-3-pentanol | di-(tert-butyl)(3-trifluoromethoxyphenyl(phosphine)chloromethylpalladium | Sodium phosphate |
| 9 | Toluene | Anisole | bis(tri-tert-butylphosphine)palladium | Potassium phosphate |
| 10 | Toluene | tert-Butyl alcohol | di-(tert-butyl)(4-methylphenyl(phosphine)chloromethylpalladium | Cesium carbonate |
| 11 | Toluene | tert-Amyl alcohol | di-(tert-butyl)(4-tert-buthylphenyl(phosphine)chloromethylpalladium | Potassium phosphate |
| 12 | Toluene | Ethylene glycol dimethyl ether | di-(tert-butyl)(3-trifluoromethoxyphenyl(phosphine)chloromethylpalladium | Sodium phosphate |
| 13 | Toluene | Tetrahydrofuran | (tri-(tert-butyl)phosphine)chloromethylpalladium | Sodium carbonate |
| 14 | Toluene | 2-Methyl tetrahydrofuran | (tri-(tert-butyl)phosphine)chloromethylpalladium | Sodium carbonate |
| 15 | Mesitylene | 2-Phenylethanol | di-(tert-butyl)(4-methylphenyl(phosphine)chloromethylpalladium | Cesium carbonate |
| 16 | Mesitylene | 1-Pentanol | di-(tert-butyl)(4-tert-buthylphenyl(phosphine)chloromethylpalladium | Potassium phosphate |

TABLE 5-continued

| Combination | First solvent | Second solvent | Catalyst | base |
|---|---|---|---|---|
| 17 | Mesitylene | 1-Methylcyclohexanol | di-(tert-butyl)(3-trifluoromethoxyphenyl(phosphine)chloromethylpalladium | Sodium phosphate |
| 18 | Mesitylene | 1-Ethylcyclohexanol | (tri-(tert-butyl)phosphine)chloromethylpalladium | Sodium carbonate |
| 19 | Mesitylene | 1-Methylcyclopentanol | di-(tert-butyl)(4-methylphenyl(phosphine)chloromethylpalladium | Cesium carbonate |
| 20 | Mesitylene | 2-Phenyl-2-propanol | di-(tert-butyl)(4-tert-buthylphenyl(phosphine)chloromethylpalladium | Potassium phosphate |
| 21 | Mesitylene | 2-Methyl-1-phenyl-2-propanol | di-(tert-butyl)(3-trifluoromethoxyphenyl(phosphine)chloromethylpalladium | Sodium phosphate |
| 22 | Mesitylene | 3-Ethyl-3-pentanol | (tri-(tert-butyl)phosphine)chloromethylpalladium | Sodium carbonate |
| 23 | Mesitylene | Anisole | di-(tert-butyl)(4-methylphenyl(phosphine)chloromethylpalladium | Cesium carbonate |
| 24 | Mesitylene | tert-Butyl alcohol | di-(tert-butyl)(4-tert-buthylphenyl(phosphine)chloromethylpalladium | Potassium phosphate |
| 25 | Mesitylene | tert-Amyl alcohol | di-(tert-butyl)(3-trifluoromethoxyphenyl(phosphine)chloromethylpalladium | Sodium phosphate |
| 26 | Mesitylene | Ethylene glycol dimethyl ether | (tri-(tert-butyl)phosphine)chloromethylpalladium | Sodium carbonate |
| 27 | Mesitylene | Tetrahydrofuran | di-(tert-butyl)(4-methylphenyl(phosphine)chloromethylpalladium | Cesium carbonate |
| 28 | Mesitylene | 2-Methyl tetrahydrofuran | di-(tert-butyl)(4-tert-buthylphenyl(phosphine)chloromethylpalladium | Potassium phosphate |
| 29 | Tetralin | 2-Phenylethanol | di-(tert-butyl)(3-trifluoromethoxyphenyl(phosphine)chloromethylpalladium | Sodium phosphate |
| 30 | Tetralin | 1-Pentanol | (tri-(tert-butyl)phosphine)chloromethylpalladium | Sodium carbonate |
| 31 | Tetralin | 1-Methylcyclohexanol | di-(tert-butyl)(4-tert-buthylphenyl(phosphine)chloromethylpalladium | Potassium phosphate |
| 32 | Tetralin | 1-Ethylcyclohexanol | di-(tert-butyl)(4-tert-buthylphenyl(phosphine)chloromethylpalladium | Potassium phosphate |
| 33 | Tetralin | 1-Methylcyclopentanol | di-(tert-butyl)(3-trifluoromethoxyphenyl(phosphine)chloromethylpalladium | Sodium phosphate |
| 34 | Tetralin | 2-Phenyl-2-propanol | (tri-(tert-butyl)phosphine)chloromethylpalladium | Sodium carbonate |
| 35 | Tetralin | 2-Methyl-1-phenyl-2-propanol | di-(tert-butyl)(4-methylphenyl(phosphine)chloromethylpalladium | Cesium carbonate |
| 36 | Tetralin | 3-Ethyl-3-pentanol | di-(tert-butyl)(4-tert-buthylphenyl(phosphine)chloromethylpalladium | Potassium phosphate |
| 37 | Tetralin | Anisole | di-(tert-butyl)(3-trifluoromethoxyphenyl(phosphine)chloromethylpalladium | Sodium phosphate |
| 38 | Tetralin | tert-Butyl alcohol | di-(tert-butyl)(4-tert-buthylphenyl(phosphine)chloromethylpalladium | Potassium phosphate |
| 39 | Tetralin | tert-Amyl alcohol | di-(tert-butyl)(4-methylphenyl(phosphine)chloromethylpalladium | Cesium carbonate |
| 40 | Tetralin | Ethylene glycol dimethyl ether | di-(tert-butyl)(4-tert-buthylphenyl(phosphine)chloromethylpalladium | Potassium phosphate |
| 41 | Tetralin | Tetrahydrofuran | bis(tri-tert-butylphosphine)palladium | Potassium phosphate |
| 42 | Tetralin | 2-Methyl tetrahydrofuran | di-(tert-butyl)(4-tert-buthylphenyl(phosphine)chloromethylpalladium | Potassium phosphate |

TABLE 6

| Combination | First solvent | Second solvent | Catalyst | Base |
|---|---|---|---|---|
| 51 | Toluene | tert-Butyl alcohol | (tri-(tert-butyl)phosphine)chloromethylpalladium | Sodium carbonate |
| 52 | Toluene | tert-Amyl alcohol | di-(tert-butyl)(4-methylphenyl(phosphine)chloromethylpalladium | Cesium carbonate |
| 53 | Toluene | Ethylene glycol dimethyl ether | di-(tert-butyl)(4-tert-buthylphenyl(phosphine)chloromethylpalladium | Potassium phosphate |
| 54 | Toluene | Tetrahydrofuran | di-(tert-butyl)(3-trifluoromethoxyphenyl(phosphine)chloromethylpalladium | Sodium phosphate |
| 55 | Toluene | 2-Methyl tetrahydrofuran | (tri-(tert-butyl)phosphine)chloromethylpalladium | Sodium carbonate |
| 56 | Mesitylene | tert-Butyl alcohol | di-(tert-butyl)(4-methylphenyl(phosphine)chloromethylpalladium | Cesium carbonate |
| 57 | Mesitylene | tert-Amyl alcohol | di-(tert-butyl)(4-tert-buthylphenyl(phosphine)chloromethylpalladium | Potassium phosphate |
| 58 | Mesitylene | Ethylene glycol dimethyl ether | di-(tert-butyl)(3-trifluoromethoxyphenyl(phosphine)chloromethylpalladium | Sodium phosphate |
| 59 | Mesitylene | Tetrahydrofuran | (tri-(tert-butyl)phosphine)chloromethylpalladium | Sodium carbonate |
| 60 | Mesitylene | 2-Methyl tetrahydrofuran | di-(tert-butyl)(4-methylphenyl(phosphine)chloromethylpalladium | Cesium carbonate |
| 61 | Tetralin | tert-Butyl alcohol | di-(tert-butyl)(4-tert-buthylphenyl(phosphine)chloromethylpalladium | Potassium phosphate |
| 62 | Tetralin | tert-Amyl alcohol | di-(tert-butyl)(3-trifluoromethoxyphenyl(phosphine)chloromethylpalladium | Sodium phosphate |
| 63 | Tetralin | Ethylene glycol dimethyl ether | (tri-(tert-butyl)phosphine)chloromethylpalladium | Sodium carbonate |
| 64 | Tetralin | Tetrahydrofuran | di-(tert-butyl)(4-tert-buthylphenyl(phosphine)chloromethylpalladium | Potassium phosphate |

TABLE 6-continued

| Combination | First solvent | Second solvent | Catalyst | Base |
|---|---|---|---|---|
| 65 | Tetralin | 2-Methyl tetrahydrofuran | di-(tert-butyl)(4-tert-buthylphenyl(phosphine)chloromethylpalladium | Potassium phosphate |

(Production Conditions)

To produce the crude polymer, a compound represented by formula (2), a compound represented by formula (3), a palladium catalyst, a base, and a reaction solvent are usually mixed, so that the compound represented by formula (2) and the compound represented by formula (3) are reacted.

The mixing order thereof is not particularly limited. For example, the compound represented by formula (2), the compound represented by formula (3), the palladium catalyst, the base, and the reaction solvent may be mixed at the same time; or after the compound represented by formula (2), the compound represented by formula (3), the base, and part of the reaction solvent are mixed, the resulting mixture may be mixed with the remaining reaction solvent and the palladium catalyst. Alternatively, after the compound represented by formula (2), the compound represented by formula (3), the palladium catalyst, and the reaction solvent are mixed, the resulting mixture and the base may be mixed.

The reaction temperature in the method of producing a crude polymer is usually in the range of −20° C. to 180° C., preferably in the range of −20° C. to 100° C., and more preferably in the range of −20° C. to 80° C. The reaction time is usually in the range of 30 min to 96 h and preferably in the range of 30 min to 48 h.

In the method of producing a crude polymer, an optional step may be included in addition to the step of reacting a compound represented by formula (2) and a compound represented by formula (3).

The optional step includes, for example, a step of reacting a compound represented by formula (2) and a compound represented by formula (3), and then separating the resulting crude polymer from the reaction mixture.

Further, the step of reacting a compound represented by formula (2) and a compound represented by formula (3) may be followed by a step of washing the resulting reaction mixture with an acidic solution such as hydrochloric acid so as to remove, from the reaction mixture, impurities such as a palladium complex and a palladium metal.

<Step (A)>

As the polymer solution used in step (A), a solution used to synthesize the crude polymer may be used as it is. Also, it is possible to use a solution prepared by dissolving the crude polymer in a solvent. Usually, as described above, a step of removing impurities such as a palladium complex and a palladium metal is performed. Thus, it is preferable to prepare a polymer solution by dissolving, in a solvent, the crude polymer obtained through the step of removing impurities. Even after the step of removing such impurities, it is difficult to remove all the impurities. Consequently, Pd atoms, Pd clusters, Pd-containing compounds, and the like may remain in the crude polymer.

The solvent in the polymer solution is not particularly limited as long as the crude polymer can be dissolved in the solvent. Examples include an aromatic solvent, an ether-based solvent, an alcohol-based solvent, an ester-based solvent, a ketone-based solvent, an aliphatic hydrocarbon solvent, an alicyclic hydrocarbon solvent, a nitrile-based solvent, an amide-based solvent, a carbonate-based solvent, a sulfur-containing solvent, or a chlorine-containing solvent.

These solvents may be used singly, or two or more kinds may be used in combination. Among them, from the viewpoint of favorable crude polymer solubility and easy removal of Pd clusters, preferred is a solvent containing at least one compound selected from the group consisting of aromatic solvents, alcohol-based solvents, and ether-based solvents. More preferred is an aromatic solvent-containing solvent. Further, in a preferred embodiment of the invention, the solvent may be a mixed solvent of an aromatic solvent and an alcohol-based solvent.

Examples of the ether-based compound include anisole, cyclopentyl methyl ether, tert-butyl methyl ether, diethyl ether, diisopropyl ether, ethylene glycol dimethyl ether, diethylene glycol dimethyl ether, tetrahydrofuran, 2-methyl tetrahydrofuran, or 1,4-dioxane.

Examples of the alcohol-based solvent include methanol, ethanol, ethylene glycol, isopropyl alcohol, propylene glycol, ethylene glycol methyl ether, ethylene glycol butyl ether, 1-methoxy-2-propanol, 2-butoxyethanol, propylene glycol monomethyl ether, or 1-methylcyclohexanol.

The aromatic solvent indicates an aromatic ring-containing solvent. Examples of the aromatic ring include a benzene ring or a naphthalene ring. Examples of the aromatic solvent include toluene, xylene (e.g., o-xylene, m-xylene, p-xylene), trimethylbenzene (e.g., mesitylene, 1,2,4-trimethylbenzene (pseudocumene)), dimethyl-ethylbenzene (e.g., 1,3-dimethyl-4-ethylbenzene), butylbenzene (e.g., n-butylbenzene, sec-butylbenzene, tert-butylbenzene), methylnaphthalene (e.g., 1-methylnaphthalene, 2-methylnaphthalene), ethylnaphthalene (e.g., 2-ethylnaphthalene), tetralin, indane, dichloro-methylbenzene (e.g., 1,2-dichloro-4-methylbenzene), cresol, chloronaphthalene (e.g., 2-chloronaphthalene), chlorobenzene, dichlorobenzene (e.g., o-dichlorobenzene), or chloro-fluorobenzene (e.g., 1-chloro-2-fluorobenzene).

Among the aromatic solvents, those containing a compound represented by formula (A) are particularly preferable from the viewpoint of favorable polymer solubility and easy removal of Pd clusters.

[Chem. 30]

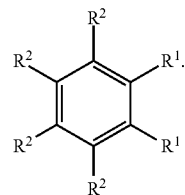

(A)

In formula (A), $R^1$ represents a halogen atom or an alkyl group. The two $R^1$ moieties may be the same or different from each other. The two $R^1$ moieties may be bonded to form a ring.

In formula (A), $R^2$ represents a hydrogen atom, a halogen atom, or an alkyl group. The plurality of $R^2$ moieties may be the same or different from one another.

Examples of the halogen atom or the alkyl group in $R^1$ or $R^2$ include any halogen atom or any alkyl group described in the Section of "(Polymer for Organic Photoelectric Conversion Material)", respectively.

As the compound represented by formula (A), any compound represented by the following formula is preferable from the viewpoint of favorable polymer solubility and easy removal of Pd clusters.

[Chem. 31]

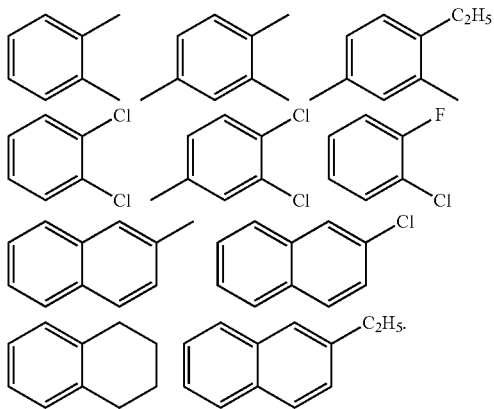

In the case of preparing a polymer solution, the crude polymer for organic photoelectric conversion material and a solvent may be, for instance, stirred and mixed to dissolve the polymer in the solvent.

The mass (also referred to as solution concentration) of the organic photoelectric conversion material can be selected, if appropriate, depending on, for example, the solubility of the organic photoelectric conversion material in the solvent, and is, for example, from 0.1 to 10 mass %, and preferably from 0.5 to 5 mass % based on the mass of the solution.

In step (A), the polymer solution is brought into contact with a chelator at a temperature of 80° C. or higher. The chelator is a non-metal ligand that binds to a metal ion in a solution. A plurality of coordinated atoms in the ligand molecule bind to one metal ion, so that the activity of the metal ion is lowered. The chelator can capture Pd clusters incorporated into the crude polymer.

Examples of the chelator include an aminocarboxylic acid-based chelator (e.g., ethylenediaminetetraacetic acid, glycol etherdiaminetetraacetic acid, nitrilotriacetic acid), a phosphonic acid-based chelator (etidronic acid)ethylenediamine, bipyridine, phenanthroline, thiourea, ethyl isocyanoacetate, thioglycerol, thiocianulic acid, sodium dibenzyldithiocarbamate, ammonium 1-pyrrolidine carbodithioate, sodium dimethyldithiocarbamate, sodium diethyldithiocarbamate, potassium isopropylxanthate, or a hydrate thereof. These chelators may be used singly, or two or more kinds may be used in combination. Among the chelators, preferred is an amine-based compound from the viewpoint of easy capture and removal of Pd clusters. More preferred is dithiocarbamate or a derivative (including a hydrate) thereof.

The amount of the chelator used is, for example, from 0.1 to 500 parts by mass, preferably from 1 to 300 parts by mass, more preferably from 5 to 100 parts by mass, and still more preferably from 7 to 50 parts by mass based on 1 part by mass of the crude polymer. When the amount of the chelator used is in the above range, it is easy to capture Pd clusters in the crude polymer, so that it is easy to reduce the number of Pd clusters in the resulting polymer.

The chelator contact temperature may be 80° C. or higher, preferably 85° C. or higher, more preferably 90° C. or higher, and still more preferably 95° C. or higher. When the contact temperature is equal to or higher than the above lower limit, it is easy to disaggregate the crude polymer, so that it is easy to release Pd clusters, and it is easy to reduce the number of Pd clusters in the resulting polymer. In addition, the chelator contact temperature is preferably 300° C. or lower and more preferably 110° C. or lower from the viewpoint of suppressing decomposition of the polymer.

The method of bringing the polymer into contact with the chelator is not particularly limited, and examples thereof include a method of adding the chelator to the polymer solution and stirring and mixing the mixture at a high temperature of 80° C. or higher. The contact time, preferably the mixing time, can be selected, if appropriate, depending on, for instance, the type of crude polymer and/or the contact temperature, and may be, for example, from about 1 min to 24 h and preferably from about 10 min to 1 h.

In step (A), from the polymer solution after brought into contact with the chelator, the polymer may be isolated by a conventional procedure such as filtration, concentration, extraction, crystallization, recrystallization, or column, and preferably by a separation means such as extraction or crystallization. This can produce a polymer for organic photoelectric conversion material. For example, the polymer solution after brought into contact with the chelator may be extracted into an organic layer by using water and an organic solvent. Next, the organic layer may be added to a solvent poorly miscible with the polymer. Then, the polymer for organic photoelectric conversion material may be precipitated.

The poor solvent indicates a solvent having low polymer solubility with the polymer or a solvent in which the polymer is not dissolved. Thus, the poor solvent can be selected, if appropriate, depending on the type of polymer. Examples include: an aromatic solvent (e.g., toluene, xylene); an ether-based solvent (e.g., tetrahydrofuran, dimethoxyethane); an alcohol-based solvent (e.g., methanol, ethanol, ethylene glycol, isopropyl alcohol, propylene glycol, ethylene glycol methyl ether, ethylene glycol butyl ether, 1-methoxy-2-propanol, 2-butoxyethanol, propylene glycol monomethyl ether); an ester-based solvent (e.g., ethyl acetate, butyl acetate); a ketone-based solvent (e.g., acetone, methyl ethyl ketone, cyclopentanone, cyclohexanone, 2-heptanone, methyl isobutyl ketone); an aliphatic hydrocarbon solvent (e.g., pentane, hexane, heptane); an alicyclic hydrocarbon solvent (e.g., ethylcyclohexane); a nitrile-based solvent (e.g., acetonitrile); an amide-based solvent (e.g., N,N-dimethylacetamide, N,N-dimethylformamide); a carbonate-based solvent (e.g., ethylene carbonate, propylene carbonate); a sulfur-containing solvent (e.g., dimethyl sulfone, dimethyl sulfoxide, sulfolane); or a chlorine-containing solvent (e.g., chloroform, chlorobenzene).

Note that the polymer for organic photoelectric conversion material in the production method of the invention is the same as the polymer for organic photoelectric conversion material described in the above Section [Polymer for Organic Photoelectric Conversion Material].

[Organic Photoelectric Conversion Element]

The invention inclusively provides an organic photoelectric conversion element including: a pair of electrodes including an anode and a cathode; and an active layer provided between the pair of electrodes and containing the organic photoelectric conversion material.

In the organic photoelectric conversion element of the invention, the active layer contains an organic photoelectric conversion material of the invention. Thus, even if the element is formed by using the organic photoelectric conversion material after long-term storage, deterioration of the material is suppressed. As a result, excellent electrical characteristics such as a low dark current and high external quantum efficiency (EQE) can be exhibited. Hence, the organic photoelectric conversion element of the invention can be used for a photodetector, an organic photodiode, a solar cell, and others.

In one embodiment of the invention, the organic photoelectric conversion element has a layer structure in which substrate/anode/hole transport layer/active layer/electron transport layer/cathode are layered in this order; or a layer structure in which substrate/cathode/electron transport layer/active layer/hole transport layer/anode are layered in this order. Note that the organic photoelectric conversion element does not have to have a hole transport layer or an electron transport layer.

<Active Layer>

The active layer contains a p-type semiconductor material (electron-donating compound) and an n-type semiconductor material (electron-accepting compound). Whether the material is a p-type semiconductor material or an n-type semiconductor material can be relatively determined from the energy level of HOMO or LUMO of the selected organic semiconductor material.

In one embodiment of the invention, the active layer preferably contains an organic photoelectric conversion material as a p-type semiconductor material. Since the organic photoelectric conversion material of the invention makes it possible to suppress an increase in the solution viscosity after storage, it is easy to adjust the viscosity of an ink composition containing the material even after long-term storage.

The thickness of the active layer is usually preferably from 1 nm to 100 µm, more preferably from 2 nm to 2000 nm, and still more preferably from 80 nm to 1000 nm.

The active layer can be produced, for example, by a coating method using an ink composition for forming an active layer (sometimes simply referred to as an ink composition or a coating liquid).

Here, the following describes an example of forming an active layer, which is a main component of an organic photoelectric conversion element, by a coating method. The step of forming such an active layer may include steps (X) and (Y) below.

(Step (X))

As a method of applying the ink composition to an application target, any suitable coating method can be used. Preferable examples of the coating method include slit coating, knife coating, spin coating, micro gravure coating, gravure coating, bar coating, inkjet printing, nozzle coating, or capillary coating. Slit coating, spin coating, capillary coating, knife coating, or bar coating is more preferable. Knife coating, slit coating, or spin coating is still more preferable.

The ink composition is applied to an application target selected depending on an organic photoelectric conversion element and a method of producing the same. In the method of producing an organic photoelectric conversion element, the ink composition is applied to a functional layer that is included in the organic photoelectric conversion element and can be next to an active layer. Thus, the application target for the ink composition differs depending on the layer structure and the layer formation order of the organic photoelectric conversion element to be produced. For example, the organic photoelectric conversion element may have a layer structure: substrate/anode/hole transport layer/active layer/electron transport layer/cathode, and the layer described on the left side is formed first. In this case, the application target for the ink composition should be a hole transport layer. In addition, for example, the organic photoelectric conversion element may have a layer structure: substrate/cathode/electron transport layer/active layer/hole transport layer/anode, and the layer described on the left side is formed first. In this case, the application target for the ink composition should be an electron transport layer.

(Step (Y))

Any suitable method can be used as a method for removing a solvent from a coating film of the ink composition, that is, a method for drying a coating film to remove a solvent and curing the coating film. Examples of the method for removing a solvent include a drying procedure such as a hot plate-use direct heating method, a hot air drying method, an infrared heating and drying method, a flash lamp annealing and drying method, or a vacuum drying method.

The step of forming the active layer may include other steps in addition to steps (X) and (Y), provided that the purpose and effect of the invention are not impaired.

The organic photoelectric conversion element in one embodiment of the invention may be an organic photoelectric conversion element including a plurality of active layers. In such a case, the plurality of active layers may be produced by repeating steps (X) and (Y) multiple times.

(Ink Composition for Forming Active Layer)

The ink composition that can be used in the above step (X) may be a solution or a dispersion such as a dispersion, an emulsion (emulsifying liquid), or a suspension (suspending liquid). The ink composition according to one embodiment of the invention is an ink composition for forming an active layer, and contains an organic photoelectric conversion material, as a p-type semiconductor material, an n-type semiconductor material, a solvent A, and, if desired, a solvent B.

The ink composition may contain only one kind of p-type semiconductor material (π-conjugated polymer), or may contain two or more kinds as a combination at any ratio.

(n-Type Semiconductor Material)

The n-type semiconductor material (electron-accepting compound) may be a low-molecular-weight compound or a high-molecular-weight compound.

Examples of the n-type semiconductor material as a low-molecular-weight compound include an oxadiazole derivative, an anthracinodimethane or a derivative thereof, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, 8-hydroxyquinoline or a metal complex of a derivative thereof, a fullerene such as C60 fullerene or a derivative thereof, or a phenanthrene derivative such as bathocuproine.

Examples of the n-type semiconductor material as a high-molecular-weight compound include polyvinylcarbazole or a derivative thereof, polysilane or a derivative thereof, a polysiloxane derivative having an aromatic amine structure in the side chain or main chain, polyaniline or a derivative thereof, polythiophene or a derivative thereof, polypyrrole or a derivative thereof, polyphenylene vinylene or a derivative thereof, polythienylene vinylene or a derivative thereof, polyquinolin or a derivative thereof, polyquinoxalin or a derivative thereof, or polyfluorene or a derivative thereof.

As the n-type semiconductor material, one or more materials selected from fullerene or a fullerene derivative are preferable, and a fullerene derivative is more preferable.

Examples of fullerene include $C_{60}$ fullerene, $C_{70}$ fullerene, $C_{76}$ fullerene, $C_{78}$ fullerene, or $C_{84}$ fullerene. Examples of the fullerene derivative include a fullerene derivative thereof. The fullerene derivative means a compound in which at least part of fullerene is modified.

Examples of the fullerene derivative include each compound represented by formulas (N-1) to (N-4) below.

[Chem. 32]

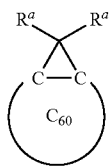

(N-1)

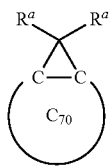

(N-2)

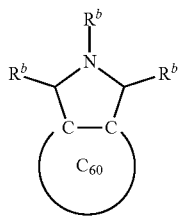

(N-3)

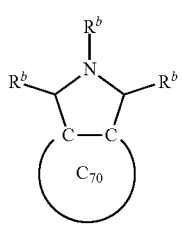

(N-4)

In formulas (N-1) to (N-4), Ra represents an alkyl group, an aryl group, a monovalent heterocyclic group, or a group having an ester structure. The plurality of Ra moieties may be the same or different from each other.

In formulas (N-1) to (N-4), $R^b$ represents an alkyl group or an aryl group. The plurality of $R^b$ moieties may be the same or different from one another.

Examples of the group having an ester structure as represented by Ra include a group represented by the following formula (19).

[Chem. 33]

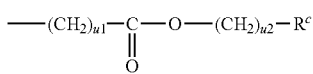

(19)

In formula (19), u1 represents an integer of 1 to 6. Then, u2 represents an integer of 0 to 6. $R^C$ represents an alkyl group, an aryl group, or a monovalent heterocyclic group.

Examples of the $C_{60}$ fullerene derivative include the following compounds.

[Chem. 34]

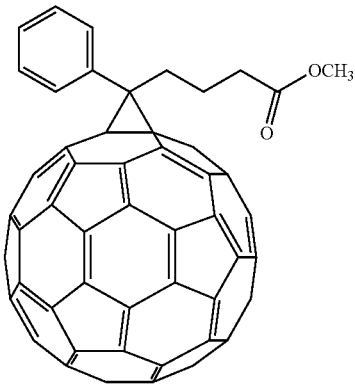

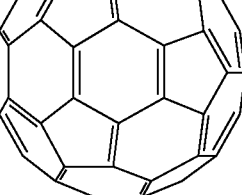
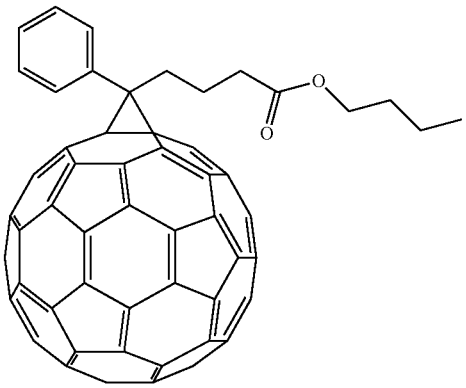

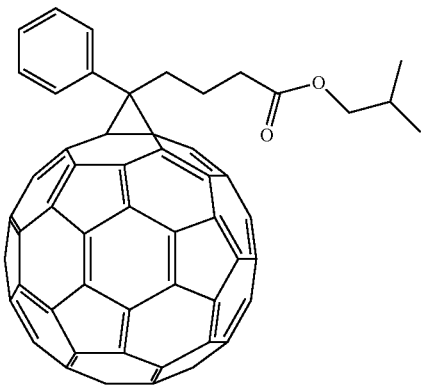

-continued

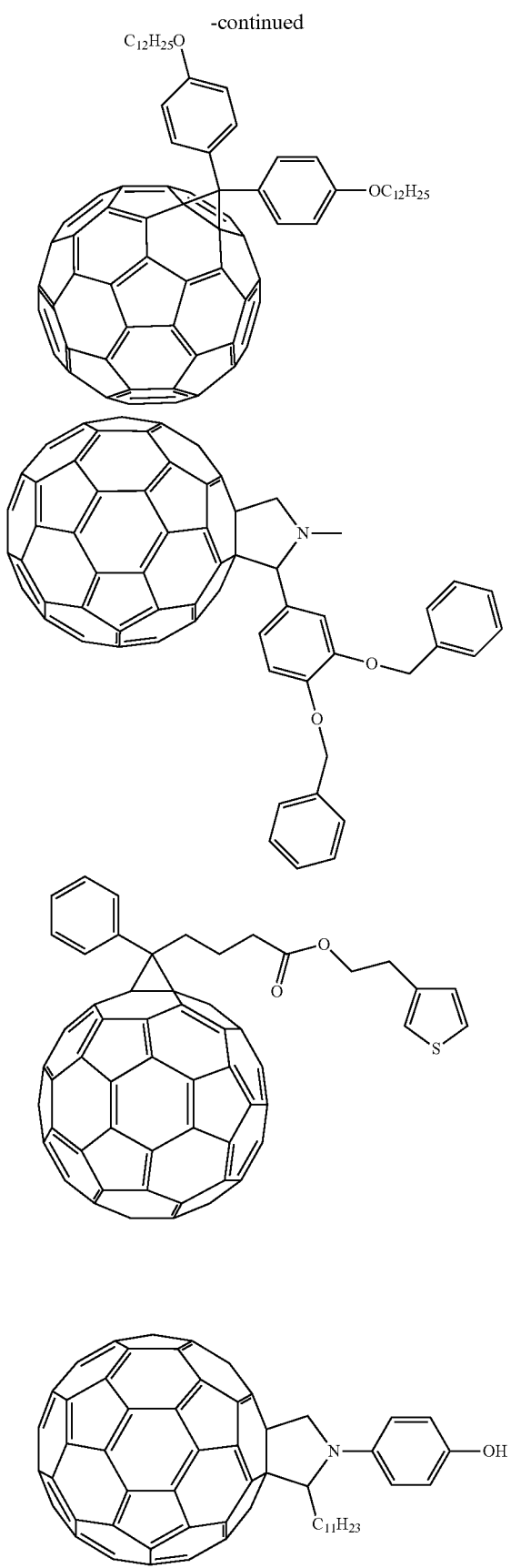

Examples of the C70 fullerene derivative include the following compounds.

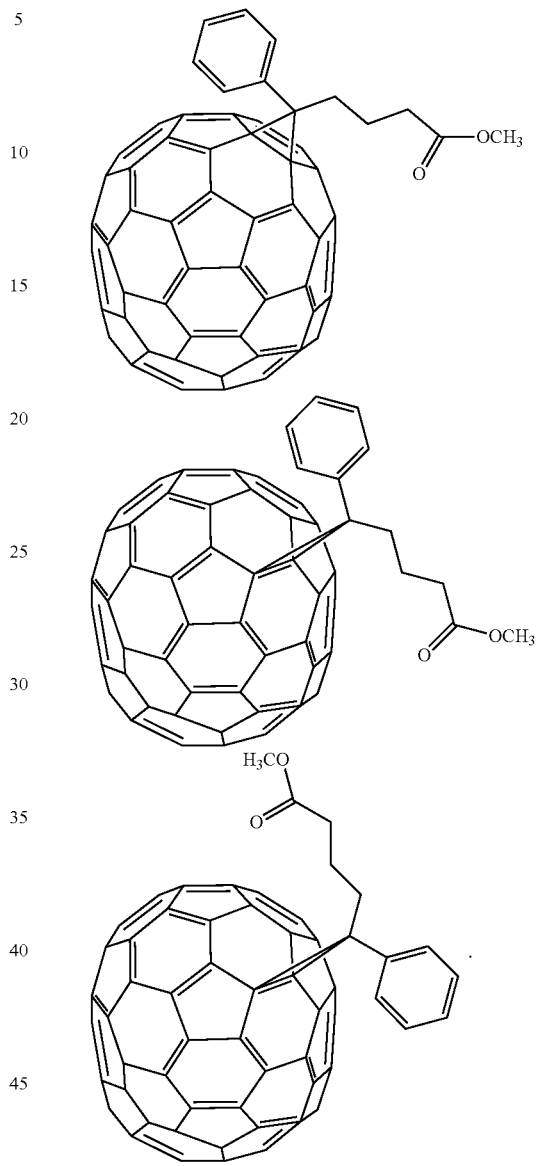

Specific examples of the fullerene derivative include [6,6]-phenyl-C61 butyric acid methyl ester (C60PCBM, [6,6]-phenyl C61 butyric acid methyl ester), [6,6]-phenyl-C71 butyric acid methyl ester (C70PCBM, [6,6]-phenyl C71 butyric acid methyl ester), [6,6]-phenyl-C85 butyric acid methyl ester (C84PCBM, [6,6]-phenyl C85 butyric acid methyl ester), or [6,6]-thienyl C61 butyric acid methyl ester ([6,6]-thienyl C61 butyric acid methyl ester).

The ink composition may contain only one kind of n-type semiconductor material, or may contain two or more kinds as a combination at any ratio.

(Solvent A)

The solvent may be selected in consideration of the solubility of the selected p-type semiconductor material and n-type semiconductor material, and the characteristics (e.g., boiling point) corresponding to the drying conditions when the active layer is formed.

The solvent A, which is the main solvent, is an optionally substituted (e.g., with an alkyl group, a halogen atom) aromatic hydrocarbon (hereinafter, simply referred to as an aromatic hydrocarbon). The solvent A is preferably selected in consideration of the solubility of the selected p-type semiconductor material and n-type semiconductor material.

Examples of such an aromatic hydrocarbon include an aromatic solvent described in the above Section [Method of Producing Polymer for Organic Photoelectric Conversion Material].

The solvent A may be composed of only one type of aromatic hydrocarbon or may be composed of two or more types of aromatic hydrocarbon. The solvent A is preferably composed of only one aromatic hydrocarbon.

Preferable examples of the solvent A include one or more solvents selected from the group consisting of toluene, o-xylene, m-xylene, p-xylene, mesitylene, pseudocumene, n-butylbenzene, sec-butylbenzene, tert-butylbenzene, methylnaphthalene, tetralin, indane, chlorobenzene, and o-dichlorobenzene. More preferred is o-xylene, pseudocumene, tetralin, chlorobenzene, or o-dichlorobenzene.

(Solvent B)

The solvent B is preferably a solvent selected from the viewpoint of enhancing the solubility of, in particular, the n-type semiconductor material. Examples of the solvent B include a ketone-based solvent (e.g., acetone, methyl ethyl ketone, cyclohexanone, acetophenone, propiophenone) or an ester-based solvent (e.g., ethyl acetate, butyl acetate, phenyl acetate, ethyl cellosolve acetate, methyl benzoate, butyl benzoate, benzyl benzoate).

The solvent B is preferably acetophenone, propiophenone, or benzyl benzoate from the viewpoint of reducing a dark current.

(Combination of Solvent A and Solvent B)

Examples of a combination of the solvent A and the solvent B include each combination listed in Table 7 below.

TABLE 7

| Solvent A | Solvent B |
|---|---|
| Pseudocumene | Propiophenone |
| Pseudocumene | Benzyl benzoate |
| Tetralin | Propiophenone |
| o-Xylene | Acetophenone |

The mass ratio (solvent A/solvent B) of the solvent A (main solvent) to the solvent B (additional solvent) is in the range of 85/15 to 95/5 from the viewpoint of further improving the solubility of the p-type semiconductor material and the n-type semiconductor material.

(Total Mass Percentage of Solvent a and Solvent B in Ink Composition)

From the viewpoint of further improving the solubility of the p-type semiconductor material and the n-type semiconductor material, the total mass of the solvent A and the solvent B contained in the ink composition when the total mass of the ink composition is 100 mass % is preferably 90 mass % or more, more preferably 92 mass % or more, and still more preferably 95 mass % or more. From the viewpoint of facilitating the formation of a film having a certain thickness or more while increasing the content of the p-type semiconductor material and the n-type semiconductor material in the ink composition, the total mass is preferably 99 mass % or less, more preferably 98 mass % or less, and still more preferably 97.5 mass % or less.

(Optional Solvent)

The ink composition may contain an optional solvent other than the solvent A and the solvent B. When the total mass of all the solvents contained in the ink composition is 100 mass %, the content of the optional solvent is preferably 5 mass % or less, more preferably 3 mass % or less, and still more preferably 1 mass % or less. As the optional solvent, a solvent having a boiling point higher than that of the solvent B is preferable.

(Optional Component)

In addition to the solvent A, the solvent B, the p-type semiconductor material (π-conjugated polymer), and the n-type semiconductor material, the ink composition includes an optional component(s) (e.g., a UV absorber, an antioxidant, a sensitizer for sensitizing the function of generating a charge by absorbed light, a photostabilizer for increasing the stability against ultraviolet rays) as long as the purpose and effect of the invention are not impaired.

(Concentration of p-Type Semiconductor Material and n-Type Semiconductor Material in Ink Composition)

The total concentration of the p-type semiconductor material and the n-type semiconductor material in the ink composition is preferably 0.01 mass % or more and 20 mass % or less, more preferably 0.01 mass % or more and 10 mass % or less, still more preferably 0.01 mass % or more and 5 mass % or less, and particularly preferably 0.1 mass % or more and 5 mass % or less. In the ink composition, the p-type semiconductor material and the n-type semiconductor material may be dissolved or dispersed. The p-type semiconductor material and the n-type semiconductor material are preferably at least partially dissolved, and more preferably all are dissolved.

(To Prepare Ink Composition)

The ink composition can be prepared by a known procedure. For example, the ink composition can be prepared by a method of preparing a mixed solvent by mixing a solvent A and a solvent B and adding a p-type semiconductor material and an n-type semiconductor material to the mixed solvent; or a method of adding a p-type semiconductor material to a solvent A and an n-type semiconductor material to a solvent B and then mixing the solvent A and the solvent B to which the respective materials have been added.

The solvent A, the solvent B, the p-type semiconductor material, and the n-type semiconductor material may be heated and mixed at a temperature equal to or lower than the boiling point of each solvent.

The solvent A, the solvent B, the p-type semiconductor material, and the n-type semiconductor material are mixed, the resulting mixture may then be filtered using a filter, and the obtained filtrate may then be used as an ink composition.

As the filter, for example, a filter formed of a fluororesin such as polytetrafluoroethylene (PTFE) can be used.

<Substrate>

The organic photoelectric conversion element is usually formed on a substrate. Electrodes including a cathode and an anode are usually formed on this substrate. The material for the substrate is not particularly limited as long as the material does not chemically change at the time of forming a layer containing, in particular, an organic compound. Examples of the substrate material include glass, plastic, polymer film, or silicon. As the substrate, it is possible to prepare and use a substrate on which an electrode(s) described later is formed or provided with a layer of a conductive material capable of functioning as an electrode by patterning. Examples of the substrate provided with a layer of a conductive material include a glass substrate on which a layer of indium tin oxide (ITO) is formed.

<Electrode>

Examples of the material for a transparent or semitransparent electrode include a conductive metal oxide film or a semitransparent metal thin film. Specific examples thereof include indium oxide, zinc oxide, tin oxide, or a composite thereof (e.g., ITO, indium zinc oxide (IZO)), a conductive material (e.g., NESA), gold, platinum, silver, or copper. As a transparent or semitransparent electrode material, ITO, IZO, or tin oxide is preferable. Further, it is possible to use, as the electrode, a transparent conductive film using an organic compound such as polyaniline or a derivative thereof or polythiophene or a derivative thereof as a material. The transparent or semitransparent electrode may be an anode or a cathode. When the substrate is opaque, it is preferable that the electrode on the side opposite to the electrode provided on the opaque substrate side (that is, the electrode on the side far from the substrate) is a transparent or semitransparent electrode.

If one electrode of the pair of electrodes is transparent or semitransparent, the other electrode may be an electrode having low light transmission. Examples of the material for the electrode having low light transmission include a metal or a conductive polymer. Specific examples of the material for an electrode having low light transmission include: a metal (e.g., lithium, sodium, potassium, rubidium, cesium, magnesium, calcium, strontium, barium, aluminum, scandium, vanadium, zinc, yttrium, indium, cerium, samarium, europium, terbium ytterbium); an alloy of two or more thereof; an alloy of one or more of the above metals and one or more metal selected from the group consisting of gold, silver, platinum, copper, manganese, titanium, cobalt, nickel, tungsten, and tin; graphite, a graphite interlayer compound; polyaniline or a derivative thereof; or polythiophene or a derivative thereof. Examples of the alloy include magnesium-silver alloy, magnesium-indium alloy, magnesium-aluminum alloy, indium-silver alloy, lithium-aluminum alloy, lithium-magnesium alloy, lithium-indium alloy, or calcium-aluminum alloy.

As a method of forming an electrode, any conventionally known suitable forming method can be used. Examples of the electrode forming method include vacuum deposition, sputtering, ion plating, or plating.

<Intermediate Layer>

The organic photoelectric conversion element may be provided with an additional intermediate layer(s) such as a charge transport layer (e.g., an electron transport layer, a hole transport layer, an electron injection layer, a hole injection layer) as an additional component for improving characteristics such as organic photoelectric conversion efficiency.

As the material used for such an intermediate layer, any conventionally known suitable material can be used. Examples of the material for the intermediate layer include a halide or oxide of an alkali metal or alkaline earth metal (e.g., lithium fluoride).

In addition, examples of the material used for the intermediate layer include fine particles of an inorganic semiconductor such as titanium oxide, or a mixture of PEDOT (poly(3,4-ethylenedioxythiophene)) and PSS (poly(4-styrene sulfonate)) (PEDOT:PSS).

The organic photoelectric conversion element may include a hole transport layer between the anode and the active layer. The hole transport layer has a function of transporting holes from the active layer to the electrode.

The hole transport layer provided in contact with the anode may be particularly referred to as a hole injection layer. The hole transport layer (hole injection layer) provided in contact with the anode has a function of promoting the injection of holes into the anode. The hole transport layer (hole injection layer) may be in contact with the active layer.

The hole transport layer contains a hole transporting material. Examples of the hole transporting material include polythiophene or a derivative thereof, an aromatic amine compound, a polymer compound containing a structural unit having an aromatic amine residue, CuSCN, CuI, NiO, or molybdenum oxide ($MoO_3$).

The organic photoelectric conversion element may include an electron transport layer between the cathode and the active layer. The electron transport layer has a function of transporting electrons from the active layer to the cathode. The electron transport layer may be in contact with the cathode. The electron transport layer may be in contact with the active layer.

The electron transport layer contains an electron transporting material. Examples of the electron transporting material include zinc oxide nanoparticles, gallium-doped zinc oxide nanoparticles, aluminum-doped zinc oxide nanoparticles, polyethyleneimine, ethoxylated polyethyleneimine (polyethyleneimineethoxylate), or PFN-P2.

The intermediate layer can be formed by substantially the same coating method as in the method of producing an active layer described above.

<Sealing Layer>

The organic photoelectric conversion element may further include a sealing layer. The sealing layer can be provided, for example, on the electrode side farther from the substrate, or on a peripheral portion of the organic photoelectric conversion element. The sealing layer can be formed by a method suitable for the selected material by using a material having a property of blocking moisture (water vapor barrier property) or a property of blocking oxygen (oxygen barrier property).

The organic photoelectric conversion element of the invention can be produced by forming an active layer between electrodes by the method described above. Further, the layer structure in which substrate/anode/hole transport layer/active layer/electron transport layer/cathode are layered in this order in one embodiment of the invention; or the layer structure in which substrate/cathode/electron transport layer/active layer/hole transport layer/anode are layered in this order can be produced, for example, by forming layers in the order from the substrate side while using the method described above.

EXAMPLES

Hereinafter, the invention will be specifically described with reference to Examples. However, the Examples do not limit the scope of the invention.

The measurement protocol and the evaluation procedure will be described below.

[Solution Preparation and Viscosity Measurement]

The solution viscosity of each polymer obtained in Examples 1 to 3 or Comparative Examples 1 to 3 before storage or after storage treatment was measured using a DV-2 Pro E type viscometer (manufactured by Brookfield, Inc.). The preparation and measurement of the viscosity measurement solution are detailed below.

First, 12.0 mg of the polymer was weighed, and 2.0 mL of 1,2,3,4-tetrahydronaphthalene was added as a solvent. This solution was heated at 80° C. for 3 h to prepare a viscosity measurement solution.

Next, 0.7 mL of the resulting viscosity measurement solution was collected and placed in a cup of the E-type viscometer. The solution viscosity was measured under conditions such that the temperature of the cup was 30° C. and the rotation speed of its spindle was 30 rpm.

The above operation was performed on the polymer before or after storage treatment, and the solution viscosity was measured. Then, the solution viscosity of the polymer after the storage treatment was divided by the solution viscosity of the polymer before the storage, and the obtained value was taken as the degree of increase in viscosity.

[Measurement Under Transmission Electron Microscope]

The number of palladium clusters (Pd clusters) per $\mu m^3$ of each polymer thin film obtained in Examples 1 to 3 or Comparative Examples 1 to 3 was measured by scanning transmission electron microscopy using a TEM (JEM2200FS, manufactured by JEOL Ltd.). The measurement protocol is detailed below.

Each polymer thin film obtained in Examples 1 to 3 or Comparative Examples 1 to 3 was cut with a knife, and the film peeled off from the substrate and floated on a water surface by immersing in water was scooped up with a TEM grid. For observation, the above TEM was used in STEM mode at an acceleration voltage of 200 kV, and each STEM image with a pixel count of 1024×1024 in the range of 667 nm×667 nm was obtained at a magnification of 200,000×.

The number of white spots, as palladium clusters (Pd clusters), present on the STEM image was recorded. The area of the thin film corresponding to one visual field of the STEM image was multiplied by the film thickness, and the number of Pd clusters was divided by the multiplied value to give the number of Pd clusters per $\mu m^3$ (counts/$\mu m^3$). The values for three visual fields were measured and averaged to give the average number of Pd clusters per $\mu m^3$ for three visual fields.

In Examples 1 to 3 and Comparative Examples 1 to 3, each polymer for organic photoelectric conversion material having the structural unit and composition designated in Table 8 below was used as an organic photoelectric conversion material.

TABLE 8

| Compound | Structural unit and composition |
|---|---|
| P-1 | 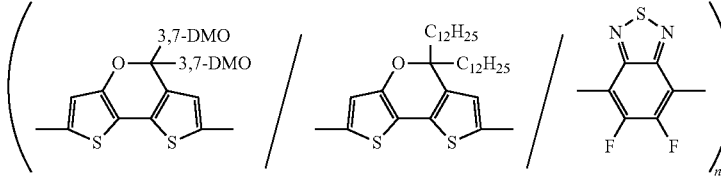 (25:25:50; mol %) 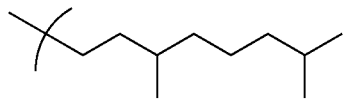 |
| P-6 | 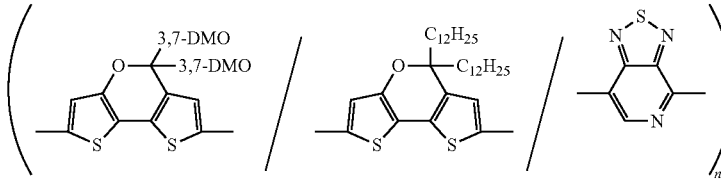 (25:25:50; mol %) 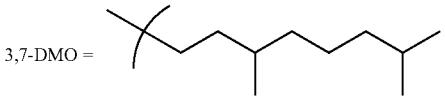 |
| P-7 | 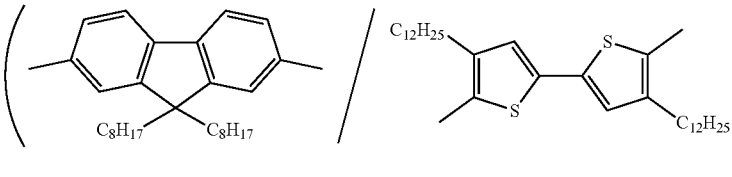 (50:50; mol %) |

Example 1

(Production of Polymer)

To a mixed solution of 1,2,3,4-tetrahydronaphthalene (23.8 mL), 1-methylcyclohexanol (23.8 mL), and the above crude polymer (P-1) (1.13 g, Mw: 62,200) synthesized with reference to the procedure described in WO 2013051676 was added 25% aqueous solution (56 mL) of sodium diethyldithiocarbamate trihydrate. Next, the mixture was stirred at 100° C. for 30 min. After removal of the aqueous layer, the organic layer was washed once with an aqueous acetic acid solution and then twice with water. The resulting solution was poured into methanol to precipitate a polymer.

The resulting polymer is designated as a polymer (E-1). Note that the amount of chelator used was 17 parts by mass based on 1 part by mass of the crude polymer.

(Formation of Polymer Thin Film)

The polymer (E-1) was dissolved in o-xylene to prepare an o-xylene solution at a concentration of 0.66 mass %. Using this o-xylene solution, a thin film (polymer thin film (E-1)) composed of polymer (E-1) is formed on poly(3,4-ethylenedioxythiophene) containing polystyrene sulfonic acid as a polyanion by spin coating. The thickness of the thin film was 0.06 μm.

(Storage of Polymer)

First, 100 mg of the polymer (E-1) was prepared and placed in a glass container A (10-mL screw tube vial) under ambient atmosphere. Next, the container A was placed in an aluminum bag with a zipper (aluminum Lamizip, manufactured by SEISANNIPPONSHA LTD.; AL-10), which is a sealable container, and the opening of the aluminum Lamizip was sealed by thermal lamination. The aluminum Lamizip encasing the polymer (E-1)-containing container A was placed in a constant temperature chamber at 60° C. and 75 RH %, and allowed to stand for one month for storage. In this way, the post-storage polymer (E-1) was obtained.

Example 2

(Production of Polymer)

To a mixed solution of 1,2,3,4-tetrahydronaphthalene (23.8 mL), 1-methylcyclohexanol (23.8 mL), and the above crude polymer (P-6) (1.14 g, Mw: 76,000) synthesized with reference to the procedure described in WO 2011052709 was added 25% aqueous solution (56 mL) of sodium diethyldithiocarbamate trihydrate. Next, the mixture was stirred at 100° C. for 30 min. After removal of the aqueous layer, the organic layer was washed once with an aqueous acetic acid solution and then twice with water. The resulting solution was poured into methanol to precipitate a polymer. The resulting polymer is designated as a polymer (E-2). Note that the amount of chelator used was 14 parts by mass based on 1 part by mass of the crude polymer.

(Formation of Polymer Thin Film and Storage of Polymer)

The same procedure as in Example 1 was repeated, except that the polymer (E-2) was used instead of the polymer (E-1), to prepare a polymer thin film (E-2) and a post-storage polymer (E-2). The thickness of the polymer thin film (E-2) was 0.06 μm.

Example 3

(Production of Polymer)

To a mixed solution of 1,2,3,4-tetrahydronaphthalene (6.3 mL), 1-methylcyclohexanol (6.3 mL), and the above crude polymer (P-7) (0.33 g) synthesized with reference to the procedure described in WO 2018220785 was added 25% aqueous solution (12 mL) of sodium diethyldithiocarbamate trihydrate. Next, the mixture was stirred at 100° C. for 30 min. After removal of the aqueous layer, the organic layer was washed once with an aqueous acetic acid solution and then twice with water. The resulting solution was poured into methanol to precipitate a polymer. The resulting polymer is designated as a polymer (E-3). Note that the amount of chelator used was 9.4 parts by mass based on 1 part by mass of the crude polymer.

(Formation of Polymer Thin Film and Storage of Polymer)

The same procedure as in Example 1 was repeated, except that the polymer (E-3) was used instead of the polymer (E-1), to prepare a polymer thin film (E-3) and a post-storage polymer (E-3). The thickness of the polymer thin film (E-3) was 0.06 μm.

Comparative Example 1

(Production of Polymer)

A mixed solution of 1,2,3,4-tetrahydronaphthalene (23.8 mL), 1-methylcyclohexanol (23.8 mL), and the above crude polymer (P-1) (1.13 g) synthesized with reference to the procedure described in WO 2013051676 was washed once with an aqueous acetic acid solution and twice with water. The resulting solution was poured into methanol to precipitate a polymer. The resulting polymer is designated as a polymer (C-1).

(Formation of Polymer Thin Film and Storage of Polymer)

The same procedure as in Example 1 was repeated, except that the polymer (C-1) was used instead of the polymer (E-1), to prepare a polymer thin film (C-1) and a post-storage polymer (C-1).

Comparative Example 2

(Production of Polymer)

A mixed solution of 1,2,3,4-tetrahydronaphthalene (23.8 mL), 1-methylcyclohexanol (23.8 mL), and the above crude polymer (P-2) (1.13 g) synthesized with reference to the procedure described in WO 2011052709 was washed once with an aqueous acetic acid solution and twice with water. The resulting solution was poured into methanol to precipitate a polymer. The resulting polymer is designated as a polymer (C-2).

(Formation of Polymer Thin Film and Storage of Polymer)

The same procedure as in Example 1 was repeated, except that the polymer (C-2) was used instead of the polymer (E-1), to prepare a polymer thin film (C-2) and a post-storage polymer (C-2).

Comparative Example 3

(Production of Polymer)

A mixed solution of 1,2,3,4-tetrahydronaphthalene (6.3 mL), 1-methylcyclohexanol (6.3 mL), and the above crude polymer (P-3) (0.33 g) synthesized with reference to the procedure described in WO 2018220785 was washed once with an aqueous acetic acid solution and twice with water. The resulting solution was poured into methanol to precipitate a polymer. The resulting polymer is designated as a polymer (C-3).

(Formation of Polymer Thin Film and Storage of Polymer)

The same procedure as in Example 1 was repeated, except that the polymer (C-3) was used instead of the polymer (E-1), to prepare a polymer thin film (C-3) and a post-storage polymer (C-3).

Figure 2:
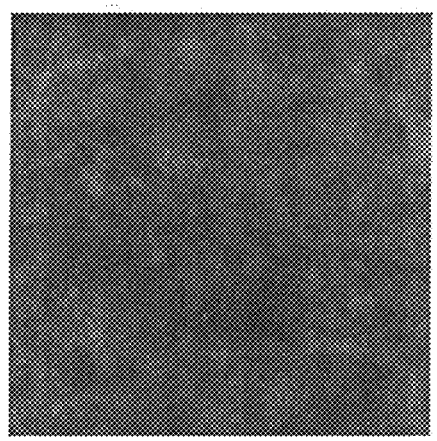
FIG. 2 is a STEM image (visual field 2) of the polymer thin film (E-1) in Example 1.
Figure 3:
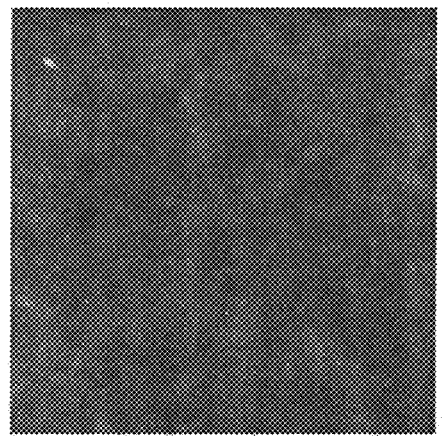
FIG. 3 is a STEM image (visual field 3) of the polymer thin film (E-1) in Example 1.
Figure 4:
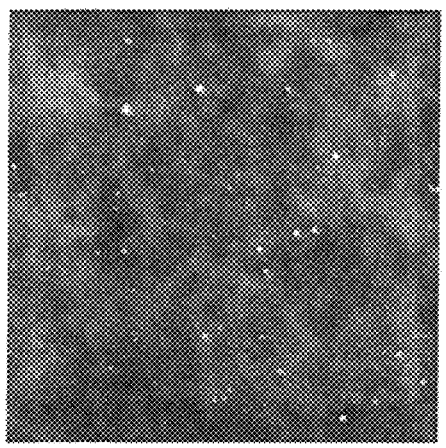
FIG. 4 is a STEM image (visual field 1) of the polymer thin film (C-1) in Comparative Example 1.
Figure 5:
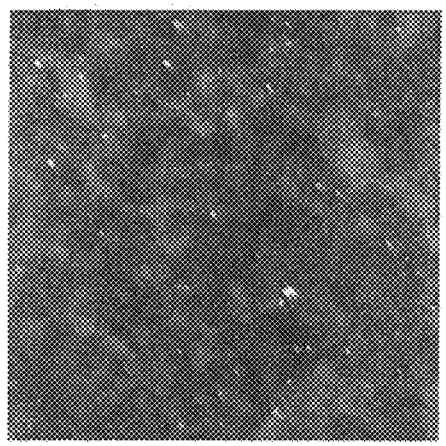
FIG. 5 is a STEM image (visual field 2) of the polymer thin film (C-1) in Comparative Example 1.
Figure 6:
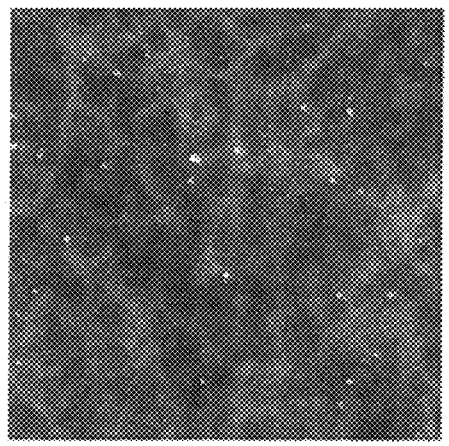
FIG. 6 is a STEM image (visual field 3) of the polymer thin film (C-1) in Comparative Example 1.
Figure 7:
FIG. 7 is a STEM image (visual field 1) of the polymer thin film (E-2) in Example 2.
Figure 8:
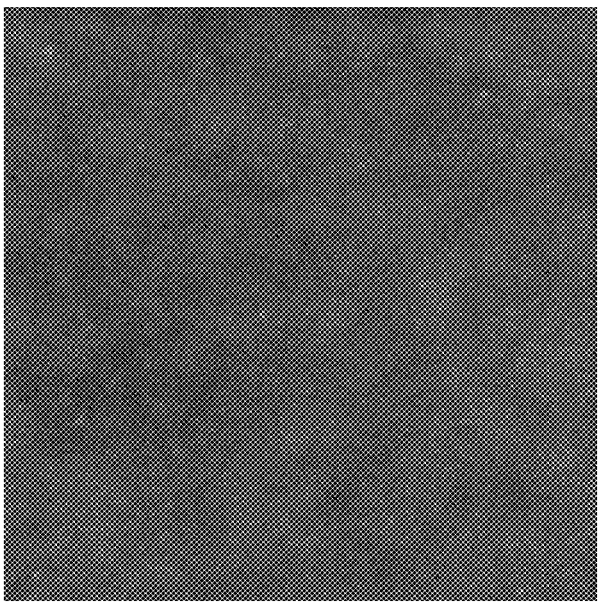
FIG. 8 is a STEM image (visual field 2) of the polymer thin film (E-2) in Example 2.
Figure 9:
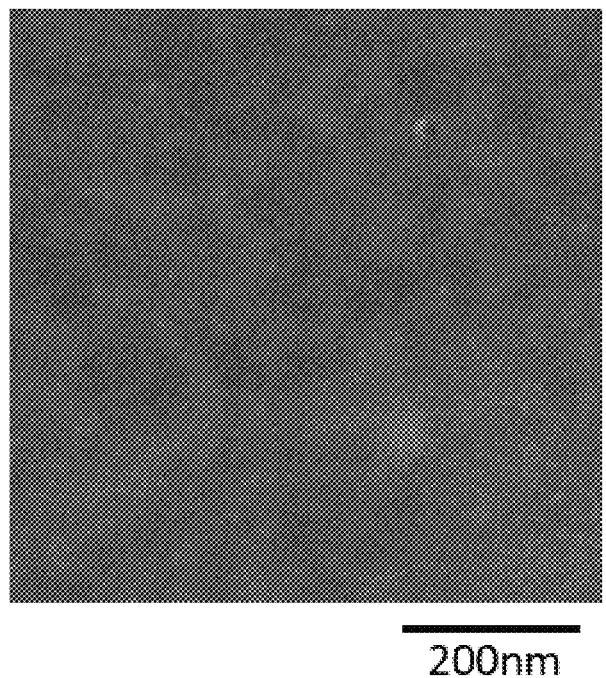
FIG. 9 is a STEM image (visual field 3) of the polymer thin film (E-2) in Example 2.
Figure 10:
FIG. 10 is a STEM image (visual field 1) of a polymer thin film (C-2) in Comparative Example 2.
Figure 11:
FIG. 11 is a STEM image (visual field 2) of the polymer thin film (C-2) in Comparative Example 2.
Figure 12:
FIG. 12 is a STEM image (visual field 3) of a polymer thin film (C-2) in Comparative Example 2.
Figure 13:
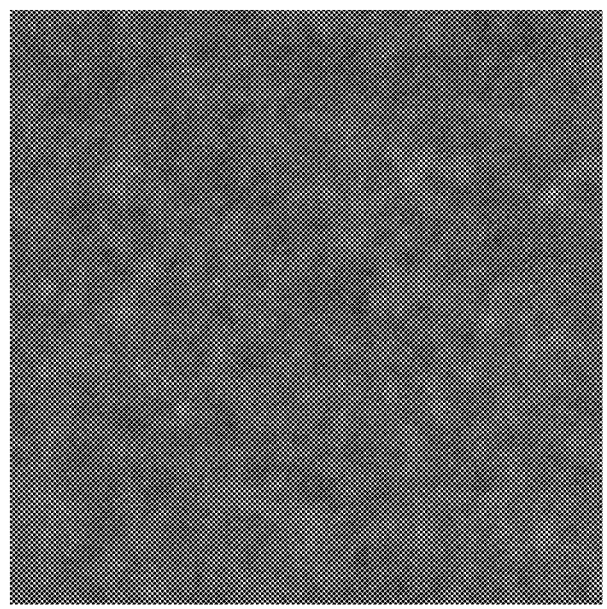
FIG. 13 is a STEM image (visual field 1) of the polymer thin film (E-3) in Example 3.
Figure 14:
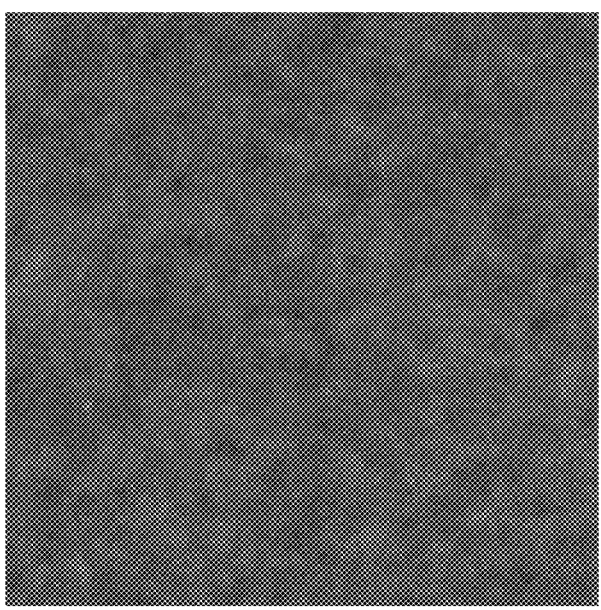
FIG. 14 is a STEM image (visual field 2) of the polymer thin film (E-3) in Example 3.
Figure 15:
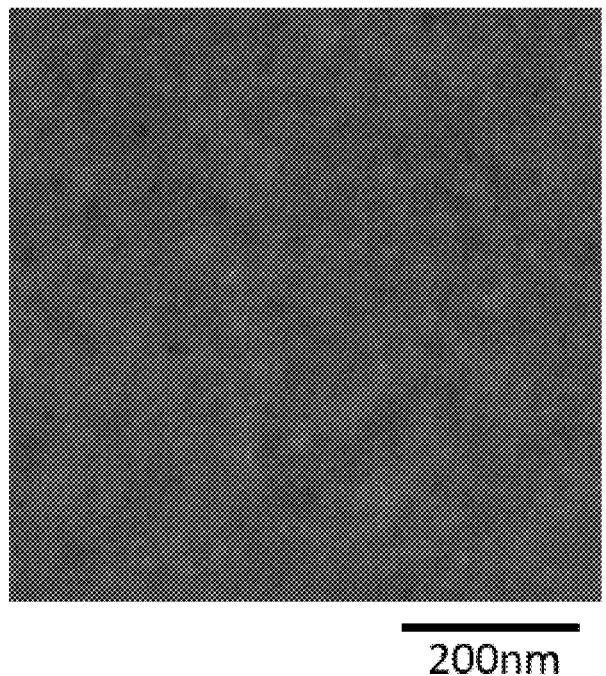
FIG. 15 is a STEM image (visual field 3) of the polymer thin film (E-3) in Example 3.
Figure 16:
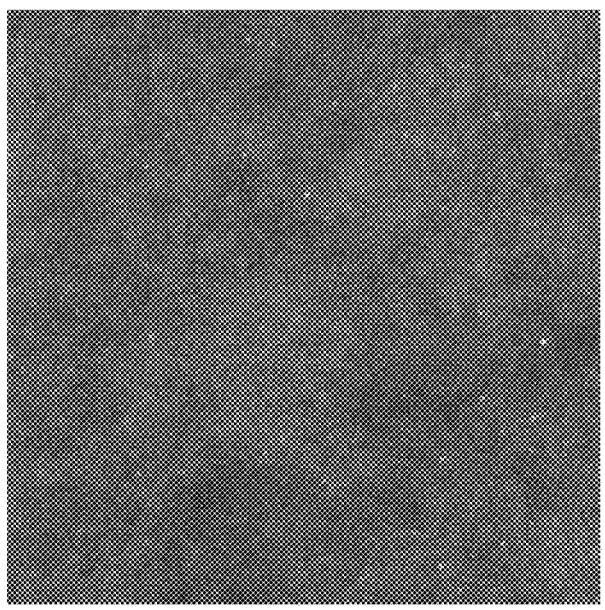
FIG. 16 is a STEM image (visual field 1) of the polymer thin film (C-3) in Comparative Example 3.
Figure 17:
FIG. 17 is a STEM image (visual field 2) of the polymer thin film (C-3) in Comparative Example 3.
Figure 18:
FIG. 18 is a STEM image (visual field 3) of the polymer thin film (C-3) in Comparative Example 3.

Table 9 shows the pre-storage solution viscosity (mPa-s) and the post-storage solution viscosity (mPa-s) of each of the polymers (E-1) to (E-3) or the polymers (C-1) to (C-3), and the average number (counts/$\mu m^3$) of Pd clusters for three visual fields (visual fields 1 to 3) of each of the polymer thin films (E-1) to (E-3) or the polymer thin films (C-1) to (C-3). Note that FIGS. 1 to 3 show STEM images of visual fields 1 to 3 of the polymer thin film (E-1), respectively. FIGS. 4 to 6 show STEM images of visual fields 1 to 3 of the polymer thin film (C-1), respectively. FIGS. 7 to 9 show STEM images of visual fields 1 to 3 of the polymer thin film (E-2), respectively. FIGS. 10 to 12 show STEM images of visual fields 1 to 3 of the polymer thin film (C-2), respectively. FIGS. 13 to 15 show STEM images of visual fields 1 to 3 of the polymer thin film (E-3), respectively. FIGS. 16 to 18 show STEM images of visual fields 1 to 3 of the polymer thin film (C-3), respectively. Table 10 shows the number of Pd clusters (counts) and the number of Pd clusters per $\mu m^3$ (count s/$\mu m^3$). Note that in each STEM image, the white spots are Pd clusters. In Examples 1 to 3, the particle diameters of the Pd clusters in the STEM images were from 1 to 20 nm.

TABLE 9

| | Average number of Pd clusters (counts/$\mu m^3$) | Solution viscosity (mPa · s) (before storage treatment) | Solution viscosity (mPa · s) (after storage treatment) | Degree of increase in viscosity |
|---|---|---|---|---|
| Example 1 | 87 | 3.3 | 3.3 | 1.00 |
| Example 2 | 100 | 3.4 | 3.4 | 1.00 |
| Example 3 | 0 | 2.8 | 2.8 | 1.00 |
| Comparative Example 1 | 2584 | 3.4 | 3.9 | 1.15 |
| Comparative Example 2 | 2810 | 3.5 | 3.8 | 1.09 |
| Comparative Example 3 | 1623 | 2.8 | 2.9 | 1.04 |

TABLE 10

| | Visual field 1 | | Visual field 2 | | Visual field 3 | |
|---|---|---|---|---|---|---|
| | Number of Pd clusters (counts) | Number of Pd clusters (counts/$\mu m^3$) | Number of Pd clusters (counts) | Number of Pd clusters (counts/$\mu m^3$) | Number of Pd clusters (counts) | Number of Pd clusters (counts/$\mu m^3$) |
| Example 1 | 0 | 0 | 3 | 112 | 4 | 150 |
| Example 2 | 5 | 187 | 2 | 75 | 1 | 37 |
| Example 3 | 0 | 0 | 0 | 0 | 0 | 0 |
| Comparative Example 1 | 66 | 2472 | 68 | 2547 | 73 | 2734 |
| Comparative Example 2 | 86 | 3222 | 71 | 2660 | 68 | 2547 |
| Comparative Example 3 | 66 | 2473 | 36 | 1349 | 28 | 1049 |

Table 9 has demonstrated that the degree of increase in viscosity between before and after the polymer storage is smaller in Examples 1 to 3 than in Comparative Examples 1 to 3, and the increase in viscosity of the polymer solution can be suppressed even after long-term storage.

Example 4

(Theoretical Quantum Calculation)

Theoretical quantum calculations were performed to investigate the mechanism by which the solution viscosity changes due to the presence of Pd clusters. First, each structure was optimized with a palladium (Pd) cluster consisting of 13 palladium atoms adjacent to the polymer (P-1). The program used was Dmol$^3$ version 7.0 (DASSAULT SYSTEMS), the functional used was PW91, and the basis function used was DNP. Next, using the resulting optimized structure, the Mulliken charges of the polymer (P-1) and the Pd cluster were determined. The program used was Gaussian 09, revision E.01 (Gaussian Inc.), the functional was M06, the basis function was LANL2DZ for the Pd cluster, and 6-31G (d) was used for the other atoms.

Table 11 shows the spin states and Mulliken charges (a) when a Pd cluster is coordinated to the polymer (P-1) and (b) when oxygen is further coordinated to the Pd cluster. Hereinafter, the polymer may be referred to as a ligand.

TABLE 12

| Structure | Spin state | Mulliken charge |
|---|---|---|
| (a) Ligand-Pd13 | singlet | −0.530 |
| (b) Ligand-Pd13-O$_2$ | triplet | −0.608 |

As shown in Table 11, it was found that when a Pd cluster was coordinated to the polymer, charge transfer occurred from the ligand to the Pd cluster, and the charge transfer was further promoted in the presence of oxygen.

Thus, it is considered from the results of theoretical quantum calculation that in Comparative Example 1 in which the number of Pd clusters is large, the charge of the polymer increases due to the influence of the Pd clusters. Also, the polymer aggregation is promoted, so that the post-storage solution viscosity increases. By contrast, in Example 1 in which the number of Pd clusters is small, the charge of the polymer is unlikely to increase and the polymer aggregation is suppressed. This seems to result in suppression of an increase in the post-storage solution viscosity.

The invention claimed is:

1. An organic photoelectric conversion material comprising palladium (Pd) clusters, wherein an average number of Pd clusters in a scanning transmission electron microscopic image of a thin film made of the organic photoelectric conversion material is 1 count/$\mu m^3$ to 500 counts/$\mu m^3$.

2. The organic photoelectric conversion material according to claim 1, wherein the Pd clusters each have a particle diameter of from 1 to 20 nm.

3. The organic photoelectric conversion material according to claim 1, wherein the organic photoelectric conversion material is a polymer for organic photoelectric conversion material.

4. The organic photoelectric conversion material according to claim 3, wherein the polymer for organic photoelectric conversion material is a D-A type π-conjugated polymer.

5. The organic photoelectric conversion material according to claim 3, wherein the polymer for organic photoelectric conversion material has a thiophene ring.

6. A method of producing a polymer for organic photoelectric conversion material containing palladium (Pd) clusters, comprising the step of:

causing a solution of the polymer to contact a chelator at a temperature of 80° C. or higher, wherein an average number of Pd clusters in a scanning transmission electron microscopic image of a thin film made of the polymer for organic photoelectric conversion material is 1 count/μm³ to 500 counts/μm³ or less.

7. The method according to claim 6, wherein a solvent in the polymer solution comprises an aromatic solvent.

8. The method according to claim 6, wherein the chelator is an amine-based compound.

9. An organic photoelectric conversion element comprising:
- a pair of electrodes including an anode and a cathode; and
- an active layer provided between the pair of electrodes and containing the organic photoelectric conversion material according to claim 1.

* * * * *